US012790720B2

(12) United States Patent
Takahashi et al.

(10) Patent No.: US 12,790,720 B2
(45) Date of Patent: Nov. 10, 2026

(54) N-TYPE GAN SUBSTRATE AND N-TYPE GAN CRYSTAL

(71) Applicant: MITSUBISHI CHEMICAL CORPORATION, Tokyo (JP)

(72) Inventors: Tatsuya Takahashi, Tokyo (JP); Yuuki Enatsu, Tokyo (JP); Takuya Hirosawa, Tokyo (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 57 days.

(21) Appl. No.: 18/926,499

(22) Filed: Oct. 25, 2024

(65) Prior Publication Data

US 2026/0110112 A1 Apr. 23, 2026

Related U.S. Application Data

(63) Continuation of application No. PCT/JP2023/016474, filed on Apr. 26, 2023.

(30) Foreign Application Priority Data

Apr. 27, 2022 (JP) ................................ 2022-073340
Feb. 28, 2023 (JP) ................................ 2023-029024

(51) Int. Cl.
*B32B 3/00* (2006.01)
*C30B 29/40* (2006.01)

(52) U.S. Cl.
CPC .............. *C30B 29/406* (2013.01); *B32B 3/00* (2013.01)

(58) Field of Classification Search
CPC .. B32B 3/00; B32B 3/263; B32B 5/14; C30B 29/406
See application file for complete search history.

(56) References Cited

U.S. PATENT DOCUMENTS

2011/0175200 A1 7/2011 Yoshida
2019/0198312 A1 6/2019 Yoshida et al.

(Continued)

FOREIGN PATENT DOCUMENTS

JP 2021183559 A 12/2021
WO WO-2020036047 A1 2/2020
WO WO-2020203541 A1 10/2020

OTHER PUBLICATIONS

International Preliminary Report on Patentability and Written Opinion issued Oct. 29, 2024, in PCT/JP2023/016474 (with English translation), 8 pages.

(Continued)

*Primary Examiner* — Elizabeth E Mulvaney
(74) *Attorney, Agent, or Firm* — Element IP, PLC

(57) ABSTRACT

An n-type GaN substrate having two main surfaces, the n-type GaN substrate being doped with Ge, having an average carrier concentration of $1\times10^{18}$ $cm^{-3}$ or more, and satisfying at least one selected from the group consisting of (1) to (3) when carrier concentrations are measured at measurement points uniformly provided in a circular region having a radius of 15 mm from the center of at least one main surface: (1) a standard deviation/average of measured values at measurement points on straight lines passing through the center of the main surface in directions of 0 degrees, 45 degrees, 90 degrees, and 135 degrees is 0.25 or less; (2) the ratio of the number of measurement points at which a carrier concentration is $2\times10^{18}$ $cm^{-3}$ or more to the total number of the measurement points is 90% or more; and (3) the ratio of the number of measurement points at which a measured value is (A) 60% or less/(B) 50% or less/(C) 40% or less of the maximum of measured values at all measurement points to the total number of the measurement points is (A) 10% or less/(B) 9% or less/(C) 8% or less. The (Continued)

n-type GaN substrate has a high carrier concentration and a uniform in-plane carrier concentration distribution.

15 Claims, 16 Drawing Sheets

(56) References Cited

U.S. PATENT DOCUMENTS

| | | | | |
|---|---|---|---|---|
| 2021/0164127 A1* | 6/2021 | Iso | ........................ | C30B 29/406 |
| 2022/0010455 A1* | 1/2022 | Iso | ........................ | C30B 29/406 |
| 2024/0279844 A1* | 8/2024 | Iso | ........................ | C30B 29/406 |
| 2025/0290228 A1* | 9/2025 | Iso | ........................ | C30B 29/406 |

OTHER PUBLICATIONS

International Search Report and Written Opinion issued Jul. 11, 2023, in PCT/JP2023/016474, 8 pages.

Combined Taiwanese Office Action and Search Report issued May 29, 2026, in corresponding Taiwanese Patent Application No. 112115603 (with English Translation), 9 pages.

Bockowski, M., et al., "Doping in bulk HVPE-GaN grown on native seeds—highly conductive and semi-insulating crystals", Journal of Crystal Growth, vol. 499, Jul. 24, 2018, pp. 1-7, 2018, XP085443641.

Extended European Search Report issued Jan. 21, 2026, in corresponding European Patent Application No. 23796436.6, 7 pages.

Iwinska, M., et al., "Crystal growth of HVPE-GaN doped with germanium", Journal of Crystal Growth, vol. 480, Oct. 12, 2017, pp. 102-107, 2017, XP085255630.

* cited by examiner

N-TYPE GAN SUBSTRATE AND N-TYPE GAN CRYSTAL

CROSS-REFERENCE TO RELATED APPLICATIONS

This application is a continuation of PCT International Application No. PCT/JP2023/016474 filed on Apr. 26, 2023, which claims priorities under 35 U.S.C § 119 (a) to Japanese Patent Applications Nos. 2022-073340 and 2023-029024, filed on Apr. 27, 2022 and Feb. 28, 2023, respectively, the entire contents of which are incorporated herein by reference.

BACKGROUND OF THE INVENTION

Field of the Invention

The present invention relates to a Ge-doped n-type GaN substrate and a Ge-doped n-type GaN crystal.

Description of the Related Art

Substrates used in InGaN-based laser diodes (LDs) currently commercially produced are conductive n-type GaN substrates doped with a donor impurity such as Si or Ge. Recently, vertical GaN power devices (PDs) using such GaN substrates have been under intense research and development. WO 2020/036047 discloses an n-type GaN crystal and c-plane GaN wafer with improved crystallinity.

SUMMARY OF THE INVENTION

In recent years, a GaN substrate with a carrier concentration higher than that of a typical GaN substrate is in demand as a GaN substrate for an LD or a GaN substrate for a vertical PD. The present inventors have conducted studies and, as a result, have found that high-concentration doping with Si, which is usually used as a donor impurity, for producing an n-type GaN substrate with a high carrier concentration causes problems that a SiN film is formed in crystal growth and the resulting GaN substrate is made fragile. Meanwhile, using Ge as a donor impurity does not cause the problems resulting from the use of Si as a dopant. However, it has been found that the GaN substrate produced by using Ge as a donor impurity has a large variation in in-plane carrier concentration distribution. This is also true of a Ge-doped GaN substrate described in WO 2020/036047.

Thus, a first object of the present invention is to provide an n-type GaN substrate having a high carrier concentration and a highly uniform in-plane carrier concentration distribution. A second object of the present invention is to provide an n-type GaN crystal useful for producing an n-type GaN substrate having a high carrier concentration and a highly uniform in-plane carrier concentration distribution.

The present inventors have diligently studied to solve the above problems and attempted to elucidate the cause of the above-described variation in carrier concentration distribution. Then, in view of a presumed cause, the present inventors have studied the growth process and conditions for the GaN crystal in producing the substrate, and have completed the present invention.

Specifically, the present invention provides the following.

[1] An n-type GaN substrate having two main surfaces, the n-type GaN substrate containing Ge as a donor impurity, having an average carrier concentration of $1\times10^{18}$ $cm^{-3}$ or more, and satisfying at least one selected from the group consisting of (1), (2), and (3) below when on at least one of the two main surfaces, a line segment (line segment A) having a length of 30 mm is defined to have a midpoint that coincides with a center of the main surface;

a line segment (line segment B) having a length of 30 mm is defined to have a midpoint that coincides with the center of the main surface and to be orthogonal to the line segment A;

among square grid points provided at intervals of 0.5 mm with respect to the line segment A and the line segment B serving as two axes, the square grid points located in a circular region having a radius of 15 mm from the center of the main surface are used as measurement points; and carrier concentrations are measured at the measurement points:

(1) an average and a standard deviation of carrier concentrations at all measurement points on the line segment A, the line segment B, and two line segments that are bisectors of angles formed by the line segment A and the line segment B satisfy Formula (i) below:

$$\text{standard deviation/average} \leq 0.25 \qquad (i);$$

(2) a ratio of the number of measurement points at which a carrier concentration is $2\times10^{18}$ $cm^{-3}$ or more to the total number of the measurement points is 90% or more; and (3) at least one selected from the group consisting of conditions (A), (B), and (C) below is satisfied:

(A) a ratio of the number of measurement points at which a measured value is 60% or less of the maximum of measured values at all measurement points to the total number of the measurement points is 10% or less;

(B) a ratio of the number of measurement points at which a measured value is 50% or less of the maximum of measured values at all measurement points to the total number of the measurement points is 9% or less; and (C) a ratio of the number of measurement points at which a measured value is 40% or less of the maximum of measured values at all measurement points to the total number of the measurement points is 8% or less.

[2] An n-type GaN substrate having two main surfaces, the n-type GaN substrate being doped with Ge as a donor impurity, having an average carrier concentration of $1\times10^{18}$ $cm^{-3}$ or more, and satisfying at least one selected from the group consisting of (1), (2), and (3) below when, on at least one of the two main surfaces, an axis substantially parallel to any crystal orientation parallel to the surface of the n-type GaN substrate and an axis perpendicular to the axis are taken; grid points are provided at intervals of 0.5 mm from a center of the main surface with respect to each of the axes; and carrier concentrations are measured using the grid points located in a circular region having a radius of 15 mm from the center of the main surface as measurement points:

(1) a standard deviation and an average of measured values at all measurement points on straight lines passing through the center of the main surface and forming angles of 0 degrees, 45 degrees, 90 degrees, and 135 degrees with the crystal orientation satisfy Formula (i) below:

$$\text{standard deviation/average} \leq 0.25 \quad \text{(i);}$$

(2) a ratio of the number of measurement points at which a carrier concentration is $2\times10^{18}$ $cm^{-3}$ or more to the total number of the measurement points is 90% or more; and (3) at least one selected from the group consisting of conditions (A), (B), and (C) below is satisfied:

(A) a ratio of the number of measurement points at which a measured value is 60% or less of the maximum of measured values at all measurement points to the total number of the measurement points is 10% or less;

(B) a ratio of the number of measurement points at which a measured value is 50% or less of the maximum of measured values at all measurement points to the total number of the measurement points is 9% or less; and (C) a ratio of the number of measurement points at which a measured value is 40% or less of the maximum of measured values at all measurement points to the total number of the measurement points is 8% or less.

[3] The n-type GaN substrate according to [2], having an orientation flat for identifying the crystal orientation.

[4] The n-type GaN substrate according to any of [1] to [3], satisfying (1).

[5] The n-type GaN substrate according to any of [1] to [3], satisfying (2).

[6] The n-type GaN substrate according to any of [1] to [3], satisfying (3).

[7] The n-type GaN substrate according to any of [1] to [3], satisfying all of (1), (2), and (3).

[8] The n-type GaN substrate according to any of [1] to [7], including:

a first region on one main surface side, the first region satisfying at least one selected from the group consisting of (1), (2), and (3); and a second region on the other main surface side, the second region having a lower carrier concentration than the first region.

[9] The n-type GaN substrate according to any of [1] to [8], wherein a donor impurity contained in the n-type GaN substrate at the highest concentration is Ge.

[10] The n-type GaN substrate according to any of [1] to [9], having a diameter of 40 mm or more.

[11] The n-type GaN substrate according to any of [1] to [10], wherein one of the two main surfaces is Ga-polar and is tilted by 0 degrees or more and 10 degrees or less relative to a (0001) crystal plane.

[12] The n-type GaN substrate according to any of [1] to [11], wherein a dislocation density in at least one main surface is $5\times10^{5}$ $cm^{-2}$ or less.

[13] An n-type GaN crystal having two main surfaces, the n-type GaN crystal being doped with Ge as a donor impurity, and having an average carrier concentration of $1\times10^{18}$ $cm^{-3}$ or more, wherein when 10 sub-square regions of 2 mm×2 mm are randomly selected on at least one of the two main surfaces, an average of 10 root-mean-square roughnesses measured at the respective 10 sub-square regions is 1 μm or less.

[14] The n-type GaN crystal according to [13], wherein the main surface including the sub-square regions is not planarized.

From another aspect of the present invention, there is provided a method for producing an n-type GaN substrate having two main surfaces, the n-type GaN substrate being doped with Ge as a donor impurity, the method including epitaxially growing a GaN crystal on a main surface on a Ga-polar side of a c-plane GaN wafer, wherein the main surface on the Ga-polar side is tilted by 0±0.1 degrees relative to a (0001) crystal plane.

From another aspect of the present invention, there is provided a method for producing an n-type GaN substrate having two main surfaces, the n-type GaN substrate being doped with Ge as a donor impurity, the method including epitaxially growing a GaN crystal on a main surface on a Ga-polar side of a c-plane GaN wafer, wherein the main surface on the Ga-polar side is tilted by 0.5 degrees or more relative to a (0001) crystal plane.

Advantageous Effects of Invention

The n-type GaN substrate of the present invention has a high carrier concentration and a highly uniform in-plane carrier concentration distribution. Thus, the n-type GaN substrate is suitable as a GaN substrate to be used in laser diodes or vertical GaN power devices.

BRIEF DESCRIPTION OF THE DRAWINGS

FIG. 1(*b*) is a diagram illustrating a circular region having a radius of 15 mm from the center of the main surface of the substrate of FIG. 1(*a*). FIG. 1(*c*) is a diagram illustrating measurement points on the substrate of FIG. 1(*a*).

FIG. 10(*b*) is a cross-sectional view illustrating a state where a GaN crystal is grown on the seed illustrated in FIG. 10(*a*).

DESCRIPTION OF THE PREFERRED EMBODIMENTS

Figure 1:
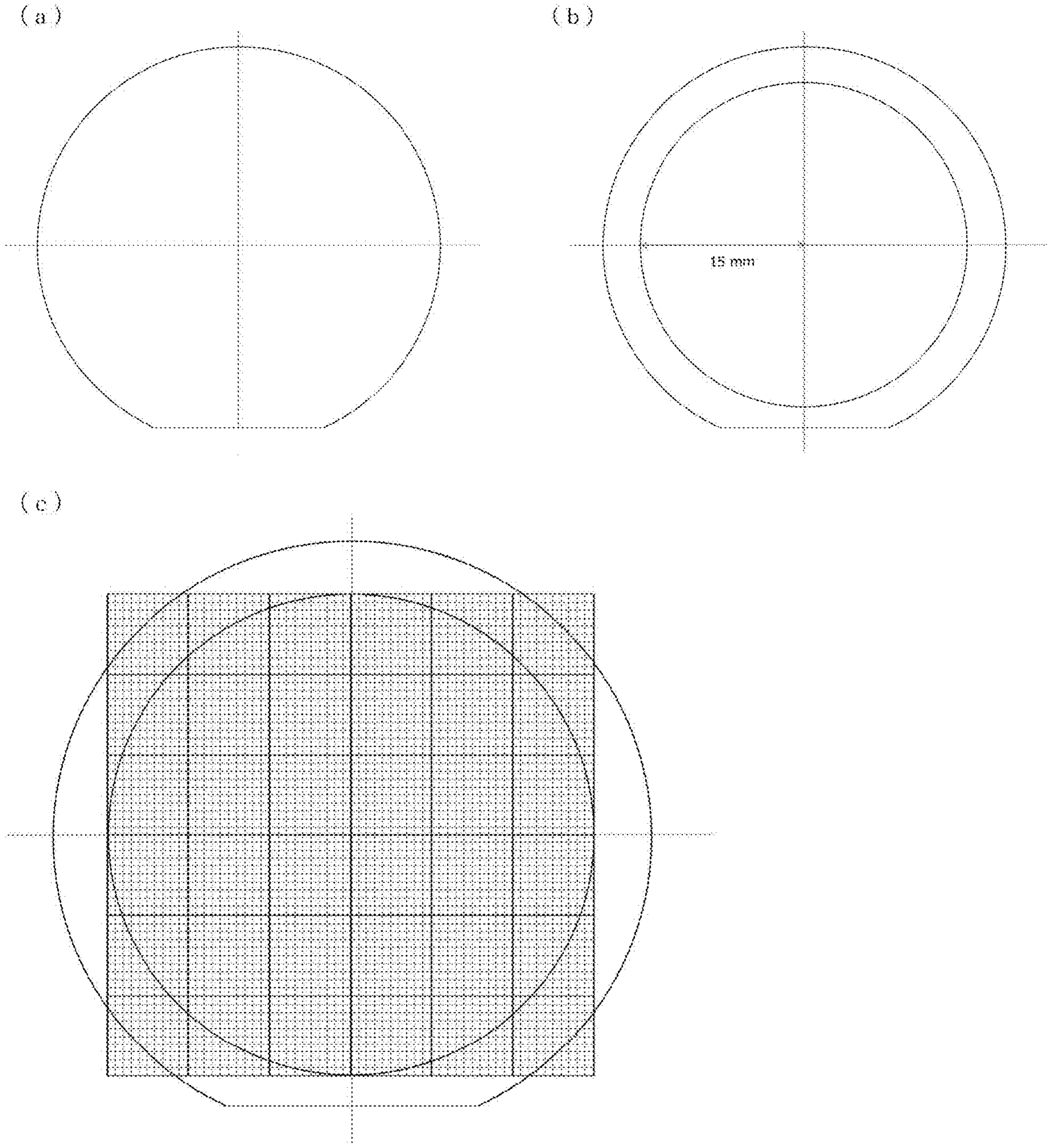
FIG. 1(*a*) is a plan view of an n-type GaN substrate having an orientation flat, as viewed from one main surface side.

The present invention will be described in detail below, but the present invention is not limited to the following embodiments and can be carried out with various modifications within the scope of the gist of the invention.

In the present specification, a (0001) crystal plane and a (000-1) crystal plane are collectively referred to as a c-plane, a {10-10} crystal plane is referred to as an m-plane, and a {11-20} crystal plane is referred to as an a-plane. The crystal axis perpendicular to the c-plane is called a c-axis, the crystal axis perpendicular to the m-plane is called an m-axis, and the crystal axis perpendicular to the a-plane is called an a-axis.

In the present specification, when a crystal axis, a crystal plane, a crystal orientation, or the like is mentioned, it means a crystal axis, a crystal plane, a crystal orientation, or the like of a GaN substrate unless otherwise specified.

The Miller index (hkil) of a hexagonal crystal has a relationship of h+k=−i and thus may be represented by three digits as (hkl). For example, a three-digit representation of (0004) is (004).

Hereinafter, embodiments of the present invention will be described with reference to the drawings as appropriate.

1. n-type GaN Substrate

1.1. n-type GaN Substrate

An n-type GaN substrate according to one embodiment of the present invention (which may be hereinafter referred to as "the present embodiment") contains Ge as a donor impurity, has two main surfaces, has an average carrier concentration of $1\times10^{18}$ $cm^{-3}$ or more, and satisfies at least one selected from the group consisting of (1), (2), and (3) below when, on at least one of the two main surfaces, a line segment (line segment A) having a length of 30 mm is defined such that a midpoint of the line segment coincides with a center of the main surface; a line segment (line segment B) having a length of 30 mm is defined such that a midpoint of the line segment coincides with the center of the main surface and the line segment is orthogonal to the line segment A; among square grid points provided at intervals of 0.5 mm with respect to the line segment A and the line segment B serving as two axes, the square grid points located in a circular region having a radius of 15 mm from the center of the main surface are used as measurement points; and carrier concentrations are measured at the measurement points:

(1) an average and a standard deviation of carrier concentrations at all measurement points on the line segment A, the line segment B, and two line segments that are bisectors of angles formed by the line segment A and the line segment B satisfy Formula (i) below:

$$\text{standard deviation/average} \leq 0.25 \qquad \text{(i);}$$

(2) a ratio of the number of measurement points at which a carrier concentration is $2\times10^{18}$ $cm^{\times3}$ or more to the total number of the measurement points is 90% or more; and (3) at least one selected from the group consisting of conditions (A), (B), and (C) below is satisfied:

(A) a ratio of the number of measurement points at which a measured value is 60% or less of the maximum of measured values at all measurement points to the total number of the measurement points is 10% or less;

(B) a ratio of the number of measurement points at which a measured value is 50% or less of the maximum of measured values at all measurement points to the total number of the measurement points is 9% or less; and (C) a ratio of the number of measurement points at which a measured value is 40% or less of the maximum of measured values at all measurement points to the total number of the measurement points is 8% or less.

The n-type GaN substrate of the present embodiment is particularly doped with Ge as a donor impurity, has two main surfaces, has an average carrier concentration of $1\times10^{18}$ $cm^{\times3}$ or more, and satisfies at least one selected from the group consisting of (1), (2), and (3) above when, on at least one of the two main surfaces, an axis substantially parallel to any crystal orientation parallel to the surface of the substrate and an axis perpendicular to the axis are taken; grid points are provided at intervals of 0.5 mm from a center of the main surface with respect to each of the axes; and carrier concentrations are measured using the grid points located in a circular region having a radius of 15 mm from the center of the main surface as measurement points.

The present inventors have conducted studies and, as a result, have found that in the case where a GaN crystal constituting a GaN substrate has a plurality of hillocks, incorporation of Ge is specifically inhibited in a boundary region between the hillocks, which may result in a large in-plane variation in the carrier concentration of the GaN substrate doped with Ge. Based on this finding, when the occurrence of a plurality of hillocks is suppressed in the growth process of a GaN crystal constituting a GaN substrate, an in-plane variation in carrier concentration can be reduced in the resultant GaN substrate even in the case of doping with Ge to achieve a higher carrier concentration than a typical GaN substrate. The present inventors have found that an n-type GaN substrate having a highly uniform in-plane carrier concentration distribution, specifically, an n-type GaN substrate satisfying at least one requirement selected from the group consisting of (1), (2), and (3) described above, can be produced by adjusting, for example, a process of preparing a seed crystal, an off-angle of the seed crystal, and the compositional proportion and flow rate of a raw material gas in growing a GaN crystal.

The n-type GaN substrate of the present embodiment may satisfy any one or any two selected from the group consisting of (1), (2), and (3), or may satisfy all of (1), (2), and (3). The n-type GaN substrate of the present invention preferably satisfies at least (1), more preferably satisfies (1) and (2) or (1) and (3), and even more preferably satisfies all of (1), (2), and (3).

1.2. Carrier Concentration

The average carrier concentration of the GaN substrate of the present embodiment is $1\times10^{18}$ $cm^{-3}$ or more. When the average carrier concentration is $1\times10^{18}$ $cm^{-3}$ or more, good conductivity is ensured. From the viewpoint of further reducing the resistance, the average carrier concentration of the GaN substrate is preferably $2\times10^{18}$ $cm^{-3}$ or more, more preferably $4\times10^{18}$ $cm^{-3}$ or more, even more preferably $5\times10^{18}$ $cm^{-3}$ or more, and particularly preferably $6\times10^{18}$ $cm^{-3}$ or more. In addition, from the viewpoint of avoiding a decrease in crystal quality, the average carrier concentration of the GaN substrate is preferably $5\times10^{19}$ $cm^{-3}$ or less, more preferably $2\times10^{19}$ $cm^{-3}$ or less, and even more preferably $1\times10^{19}$ $cm^{-3}$ or less.

In the present specification, the average carrier concentration of the GaN substrate refers to the average of carrier concentrations measured in a circular region having a radius of 15 mm from the center of the GaN substrate. Specifically, the average of carrier concentrations measured by Raman spectroscopy at 10812 measurement points present in a circular region having a radius of 15 mm from the substrate center is defined as the average carrier concentration.

The measurement points are defined as follows.

When, on at least one of the two main surfaces of the n-type GaN substrate, a line segment (line segment A) having a length of 30 mm is defined such that the midpoint of the line segment coincides with the center of the main surface; a line segment (line segment B) having a length of 30 mm is defined such that the midpoint of the line segment coincides with the center of the main surface and the line segment is orthogonal to the line segment A; and square grid points are provided at intervals of 0.5 mm with respect to the line segment A and the line segment B serving as two axes, the measurement points are the square grid points in a circular region having a radius of 15 mm from the center of the main surface. For example, an axis substantially parallel to any crystal orientation parallel to the n-type GaN substrate surface and another axis perpendicular to the axis are defined, and grid points can be provided at intervals of 0.5 mm from the center of either one of the main surfaces of the substrate, with respect to each of the axes. Among the thus-provided grid points, the grid points within a circular region having a radius of 15 mm from the substrate center are the measurement points. In one embodiment, the aforementioned crystal orientation may be the orientation of an orientation flat formed in the substrate.

Exemplary measurement points on a substrate having an orientation flat (OF) will be specifically described with reference to FIG. 1.

FIG. 1(*a*) is a plan view of a substrate having an OF, as viewed from one main surface side. FIG. 1(*b*) is a diagram illustrating a circular region having a radius of 15 mm from the center of the main surface of the substrate of FIG. 1(*a*). As illustrated in FIG. 1(*c*), straight lines substantially parallel to the OF and straight lines perpendicular to the axes are defined at intervals of 0.5 mm. In this case, the straight lines are defined so as to include straight lines passing through the center of the main surface. Points at which these straight lines intersect are grid points. Among the grid points, the grid points in the circular region are the measurement points.

The n-type GaN substrate according to the present embodiment satisfies at least one requirement selected from the group consisting of (1), (2), and (3). The "measurement points" described above are common to all requirements (1), (2) and (3).

1.3. Requirement (1)

Requirement (1) is as follows.

(1) The average and standard deviation of carrier concentrations at all measurement points on the line segment A, the line segment B, and two line segments that are bisectors of angles formed by the line segment A and the line segment B satisfy Formula (i) below:

$$\text{standard deviation/average} \leq 0.25 \qquad \text{(i)}$$

For example, the standard deviation and average of measured values at all measurement points on straight lines passing through the center of at least one of the two main surfaces of the n-type GaN substrate and forming angles of 0 degrees, 45 degrees, 90 degrees, and 135 degrees with the crystal orientation described above may satisfy Formula (i) above. In other words, when line segments having a length of 30 mm passing through the center of at least one of the two main surfaces of the n-type GaN substrate and forming angles of 0 degrees, 45 degrees, 90 degrees, and 135 degrees with any crystal orientation parallel to the substrate surface are defined such that the midpoint of each line segment coincides with the center of the main surface, the standard deviation and average of measured values at all measurement points (43 or 61 grid points for each line segment) on the four line segments may satisfy Formula (i).

In the present specification, the "standard deviation/average" described above may be referred to as a variation coefficient of carrier concentration.

When the variation coefficient of carrier concentration defined above is 0.25 or less, the n-type GaN substrate has a small in-plane variation in carrier concentration and is excellent as a substrate for LDs.

In requirement (1), the n-type GaN substrate according to the present embodiment preferably has an orientation flat (OF) indicating the crystal orientation described above.

In requirement (1), the n-type GaN substrate according to the present embodiment has a variation coefficient of carrier concentration defined above of 0.25 or less.

The variation coefficient of carrier concentration of the GaN substrate can be determined as follows. Firstly, on at least one main surface of the GaN substrate, carrier concentrations are measured by Raman spectroscopy at all measurement points on a total of four line segments, i.e., the line segment A, the line segment B, and two line segments that are bisectors of angles formed by the line segment A and the line segment B. Next, an average and a standard deviation are calculated for the carrier concentrations measured on the four line segments. "Standard deviation/average" is calculated from the calculated average and standard deviation, and the variation coefficient of carrier concentration is calculated. The four line segments may be, for example, a total of four line segments which have a length of 30 mm, pass through the center of the main surface, form angles of 0 degrees, 45 degrees, 90 degrees, and 135 degrees with the crystal orientation of the substrate surface, and are defined such that the midpoint of each line segment coincides with the center of the main surface.

Figure 2:
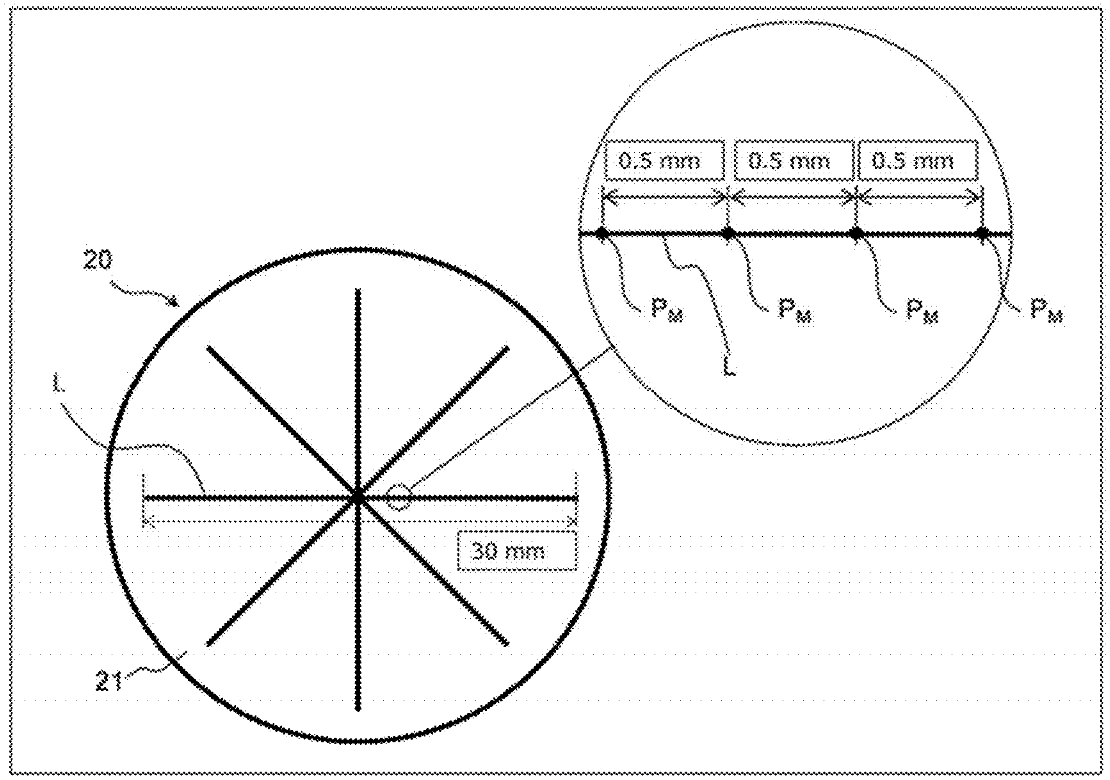
FIG. 2 is a plan view of exemplary four line segments defined on one example of an n-type GaN substrate.

FIG. 2 illustrates a plan view of an example of the four line segments defined on an exemplary n-type GaN substrate.

Figure 3:
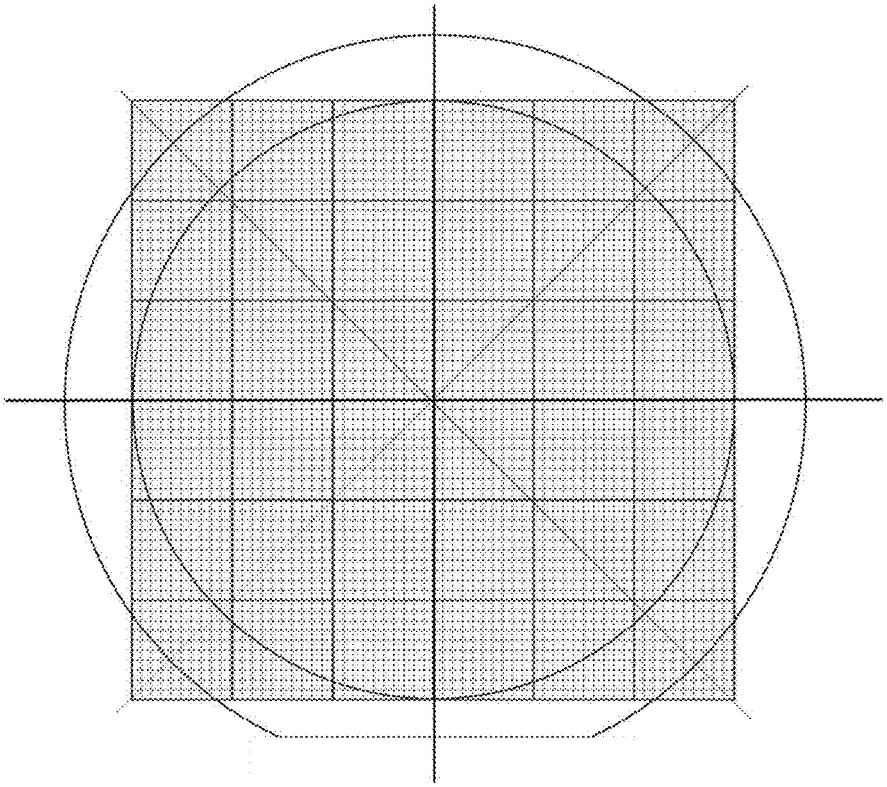
FIG. 3 is a diagram illustrating measurement points on four line segments in one example of an n-type GaN substrate.

On the line segment A and the line segment B (e.g., on the line segments forming angles of 0 degrees and 90 degrees with the reference crystal orientation: see FIG. 3), the interval between measurement points of carrier concentration is 0.5 mm, and the number of measurement points on the line segments is 59. On two line segments that are bisectors of angles formed by the line segment A and the line segment B (e.g., on the line segments forming angles of 45 degrees and 135 degrees with the reference crystal orientation: see FIG. 3), the interval between measurement points of carrier concentration is 0.5 mm$\times\sqrt{2}$, and the number of measurement points on the line segments is 43.

The variation coefficient of carrier concentration is 0.25 or less, but from the viewpoint of further reducing a variation in carrier concentration, the variation coefficient is preferably 0.2 or less, more preferably 0.15 or less, and even more preferably 0.1 or less. The variation coefficient of carrier concentration is preferably as small as possible, and thus the lower limit is not particularly limited but is usually 0.001 or more.

The fact that the variation coefficient of carrier concentration defined above is small means that a variation in carrier concentration is small over the entire surface of the GaN substrate. For example, in the case of calculating the variation coefficient of carrier concentration from the measurement results of carrier concentration on one line segment having a length 30 mm and passing through the center of the GaN substrate, the proportion of the line segment used for measurement is small relative to the entire main surface of the GaN substrate, and the results cannot be said to be appropriate as an index for measuring an in-plane variation in the carrier concentration of the GaN substrate. In contrast to this, the variation coefficient of carrier concentration defined above is suitable as an index for measuring an in-plane variation in the carrier concentration of the GaN substrate.

1.4. Requirement (2)

Requirement (2) is as follows.

(2) On at least one of the two main surfaces of the n-type GaN substrate, in a circular region having a radius of 15 mm from the center of the main surface, the area of a region having a carrier concentration of $2\times10^{18}$ $cm^{-3}$ or more is 90% or more relative to the area of the circular region. Specifically, the ratio of the number of measurement points at which the carrier concentration measured by Raman spectroscopy is $2\times10^{18}$ $cm^{-3}$ or more to the total number of the measurement points is 90% or more.

When the area of a region having a carrier concentration of $2\times10^{18}$ $cm^{-3}$ or more in the circular region having a radius of 15 mm from the center of the main surface is 90% or more relative to the area of the circular region, the n-type GaN substrate has a small in-plane variation in carrier concentration and is excellent as a substrate for LDs.

In requirement (2), the ratio of the number of measurement points at which the carrier concentration is $2\times10^{18}$ $cm^{-3}$ or more to the total number of the measurement points is 90% or more on at least one main surface of the n-type GaN substrate according to the present embodiment. The ratio of the number of measurement points at which the carrier concentration is $2\times10^{18}$ $cm^{-3}$ or more to the total number of the measurement points is preferably 92% or more, more preferably 94% or more, and particularly preferably 95% or more, from the viewpoint of reducing the resistance of the GaN substrate. The upper limit of the ratio is 100%.

Specifically, the ratio of the area of a region having a carrier concentration of $2\times10^{18}$ $cm^{-3}$ or more to the area of the circular region having a radius of 15 mm from the center of the main surface is calculated as follows. The ratio is calculated by dividing the number of points at which the carrier concentration is $2\times10^{18}$ $cm^{-3}$ or more among all measurement points by the total number of the measurement points. The ratio is calculated as follows: 10812 grid points in the circular region having a radius of 15 mm from the substrate center are used as measurement points; carrier concentrations at the 10812 points are measured by Raman spectroscopy; and the number of points at which the carrier concentration is $2\times10^{18}$ $cm^{-3}$ or more among the 10812 measurement points is divided by 10812.

1.5. Requirement (3)

Requirement (3) is as follows.

(3) The n-type GaN substrate satisfies at least one selected from the group consisting of conditions (A), (B), and (C) below on at least one main surface:

condition (A): the ratio of the number of measurement points at which a measured value is 60% or less of the maximum of measured values at all measurement points to the total number of the measurement points is 10% or less;

condition (B): the ratio of the number of measurement points at which a measured value is 50% or less of the maximum of measured values at all measurement points to the total number of the measurement points is 9% or less; and condition (C): the ratio of the number of measurement points at which a measured value is 40% or less of the maximum of measured values at all measurement points to the total number of the measurement points is 8% or less.

In other words, condition (A) means that, in the circular region having a radius of 15 mm from the center of the main surface, the area of a region (X1) defined below relative to the area of the circular region is 10% or less, condition (B) means that, in the circular region having a radius of 15 mm from the center of the main surface, the area of a region (X2) defined below relative to the area of the circular region is 9% or less, and condition (C) means that, in a circular region having a radius of 15 mm from the center of the main surface, the area of a region (X3) defined below relative to the area of the circular region is 8% or less.

Region (X1): a region having a carrier concentration of 60% or less of the maximum carrier concentration on the main surface Region (X2): a region having a carrier concentration of 50% or less of the maximum carrier concentration on the main surface Region (X3): a region having a carrier concentration of 40% or less of the maximum carrier concentrations on the main surface The n-type GaN substrate satisfying at least one of the above conditions (A) to (C) has a small in-plane variation in carrier concentration and is excellent as a substrate for LDs.

In requirement (3), the n-type GaN substrate according to the present embodiment satisfies at least one of the above conditions (A) to (C) on at least one main surface.

Condition (A) requires that the ratio of the number of measurement points at which a measured value is 60% or less of the maximum measured value to the total number of the measurement points be 10% or less.

The maximum measured value is the maximum value of the carrier concentrations in the circular region having a radius of 15 mm from the center of the main surface and refers to the maximum value among the carrier concentration values at all the measurement points.

In condition (A), the ratio of the number of measurement points at which a measured value is 60% or less of the maximum measured value to the total number of the measurement points is 10% or less, but from the viewpoint of further reducing a variation in carrier concentration in the main surface, the ratio is more preferably 8% or less, even more preferably 5% or less, and particularly preferably 3% or less.

In condition (A), the ratio of the number of measurement points at which a measured value is 60% or less of the maximum measured value to the total number of the measurement points is specifically calculated as follows. The maximum of carrier concentrations among the measured values at the measurement points is determined as the maximum carrier concentration. Next, the number of measurement points having a carrier concentration of 60% or less of the maximum carrier concentration among the measurement points is divided by the total number of the measurement points to thereby calculate the ratio. In one embodiment, any crystal orientation parallel to the substrate surface may be the orientation of an orientation flat. 10812 grid points in the circular region having a radius of 15 mm from the center of the substrate are used as measurement points, and carrier concentrations at the 10812 points are measured by Raman spectroscopy. The number of measurement points at which the carrier concentration is 60% or less of the maximum carrier concentration among the 10812 measurement points is divided by 10812 to thereby calculate the ratio.

Condition (B) requires that the ratio of the number of measurement points at which a measured value is 50% or less of the maximum measured value to the total number of the measurement points be 9% or less.

In condition (B), the ratio of the number of measurement points at which a measured value is 50% or less of the maximum measured value to the total number of the measurement points is 9% or less, but from the viewpoint of further reducing a variation in carrier concentration in the main surface, the ratio is more preferably 7% or less, even more preferably 5% or less, and particularly preferably 3% or less.

The ratio of the number of measurement points at which a measured value is 50% or less of the maximum measured value to the total number of the measurement points can be calculated in the same manner as in the ratio in condition (A).

Condition (C) requires that the ratio of the number of measurement points at which a measured value is 40% or less of the maximum measured value to the total number of the measurement points be 8% or less.

In condition (C), the ratio of the number of measurement points at which a measured value is 40% or less of the maximum measured value to the total number of the measurement points is 8% or less, but from the viewpoint of further reducing a variation in carrier concentration in the main surface, the ratio is more preferably 6% or less, even more preferably 4% or less, and particularly preferably 2% or less.

The ratio of the number of measurement points at which a measured value is 40% or less of the maximum measured value to the total number of the measurement points can be calculated in the same manner as in the ratio in condition (A).

In requirement (3), the n-type GaN substrate according to the present embodiment satisfies at least one of the above conditions (A) to (C) on at least one main surface, but preferably satisfies any of the conditions (A) and (B), the conditions (B) and (C), and the conditions (C) and (A), and more preferably satisfies all of the conditions (A) to (C).

1.6. Donor Impurity

In the present embodiment, the n-type GaN substrate contains a donor impurity. For example, the n-type GaN substrate is doped with Ge as a donor impurity. The Ge-doped n-type GaN substrate may be further doped with a donor impurity other than Ge, but the donor impurity contained in the GaN substrate at the highest concentration is preferably Ge.

The entirety of the n-type GaN substrate may be composed of a region intentionally doped with Ge, or only a part of the GaN substrate may be intentionally doped with Ge.

1.7. Main Surface

The n-type GaN substrate according to the present embodiment has two main surfaces. The plane orientations of the two main surfaces are not particularly limited, but, preferably, one of the two main surfaces is Ga-polar and is tilted by 0 degrees or more and 10 degrees or less relative to the (0001) crystal plane. In the present specification, the GaN substrate which is tilted by 0 degrees or more and 10 degrees or less from the (0001) crystal plane or the (000-1) crystal plane may be called "c-plane GaN substrate".

The n-type GaN substrate according to the present embodiment preferably satisfies at least one condition selected from the group consisting of (1), (2), and (3) described above at least on the Ga-polar main surface which is tilted by 0 degrees or more and 10 degrees or less relative to the (0001) crystal plane.

In the n-type GaN substrate according to the present embodiment, the "first main surface" is a main surface supposed to be used for epitaxial growth of a nitride semiconductor when, for example, the GaN substrate is used for producing a nitride semiconductor device. That is, the first main surface is a "front surface". The first main surface is mirror-finished, and its root-mean-square (RMS) roughness measured with an atomic force microscope (AFM) is preferably less than 2 nm and may be less than 1 nm or less than 0.5 nm in a measurement range of 2 μm×2 μm.

The "second main surface" is a "back surface" and may be mirror-finished or matte-finished.

The n-type GaN substrate according to the present embodiment preferably satisfies at least one condition selected from the group consisting of (1), (2), and (3) described above at least on the first main surface.

1.8. Specific Examples and Others

Figure 4:
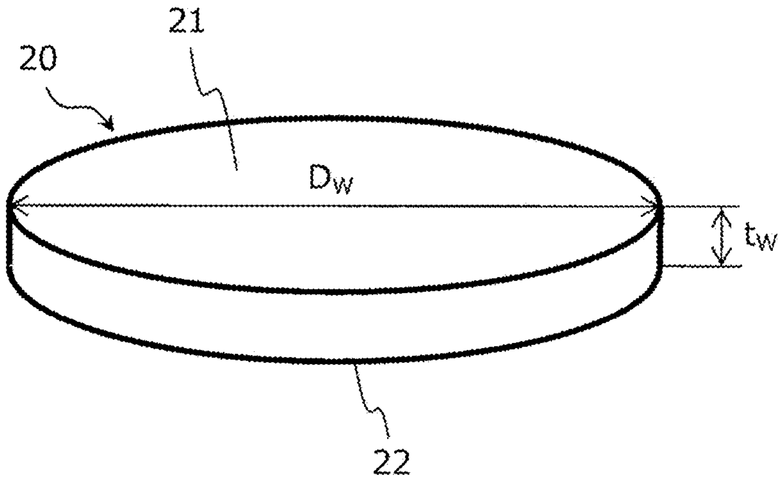
FIG. 4 is a perspective view illustrating an n-type GaN substrate according to an embodiment.

A GaN substrate 20 illustrated in FIG. 4 is an example of the n-type GaN substrate according to the present embodiment.

The GaN substrate 20 is a c-plane GaN substrate, and one of its two main surfaces (large-area surfaces) opposite to each other, that is, a first main surface 21 and a second main surface 22, is Ga-polar, and the other is N-polar. The main surface on the Ga-polar side may be referred to as a Ga-polar surface, and the main surface on the N-polar side may be called an N-polar surface.

When the first main surface 21 is Ga-polar, the tilt angle of the first main surface 21 to the (0001) crystal plane is 0 degrees or more and 10 degrees or less. The tilt angle may be 0.2 degrees or more and may be less than 5 degrees, less than 2.5 degrees, less than 1.5 degrees, less than 1 degree, or less than 0.5 degrees.

When the first main surface 21 is N-polar, the tilt angle of the first main surface 21 relative to the (000-1) crystal plane is 0 degrees or more and 10 degrees or less. The tilt angle may be less than 5 degrees, less than 2.5 degrees, less than 1.5 degrees, less than 1 degree, or less than 0.5 degrees.

The first main surface 21 and the second main surface 22 are preferably parallel to each other.

The diameter $D_w$ of the n-type GaN substrate according to the present embodiment is usually 40 mm or more or 45 mm or more, may be 95 mm or more or 145 mm or more, and is typically, for example, from 50 to 55 mm (about 2 inches), from 100 to 105 mm (about 4 inches), or from 150 to 155 mm (about 6 inches).

The thickness $t_w$ of the GaN substrate is designed depending on the diameter $D_w$ such that the GaN substrate is self-supportable and handleable. For example, when the diameter $D_w$ of the GaN substrate is about 2 inches, the thickness $t_w$ is preferably from 250 to 500 μm and more preferably from 300 to 450 μm, whereas when the diameter $D_w$ of the GaN substrate is about 4 inches, the thickness $t_w$ is preferably from 400 to 800 μm and more preferably from 500 to 650 μm. When the diameter $D_w$ of the GaN substrate is about 6 inches, the thickness $t_w$ is preferably from 500 to 850 μm and more preferably from 600 to 750 μm.

Figure 5:
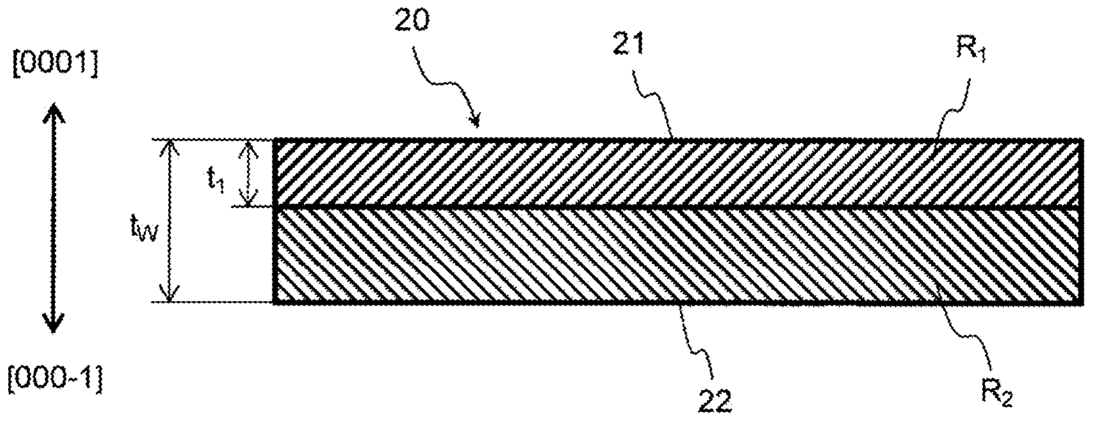
FIG. 5 is a cross-sectional view illustrating an n-type GaN substrate according to an embodiment.

In an example illustrated in FIG. 5, the GaN substrate 20 has a first region $R_1$ made of "intentionally doped GaN (ID-GaN)", which has undergone an intentional doping, on the Ga-polar first main surface 21 side and has a second region $R_2$ made of "un-intentionally doped GaN (UID-GaN)", which has not undergone intentional doping, on the N-polar second main surface 22 side. The first region $R_1$ has a higher carrier concentration and a lower resistivity than the second region $R_2$.

In the n-type GaN substrate according to the present embodiment, at least the main surface on the first region $R_1$ side (Ga-polar first main surface 21) preferably satisfies at least one condition selected from the group consisting of (1), (2), and (3) described above.

Between the first region $R_1$ and the second region $R_2$, an intermediate region (not illustrated) having a carrier concentration between the carrier concentrations of these two regions may be provided. In this intermediate region, the carrier concentration may increase continuously or stepwise from the N-polar side toward the Ga-polar side.

The thickness $t_1$ of the first region $R_1$ can be, for example, 5 μm or more and less than 50 μm, 50 μm or more and less than 100 μm, 100 μm or more and less than 150 μm, or 150 μm or more and 250 μm or less.

A regrowth interface may be present between the first region $R_1$ and the second region $R_2$. That is, the GaN substrate 20 illustrated in FIG. 5 may be produced through a process in which, after a c-plane GaN wafer made of UID-GaN is completed, an ID-GaN layer is grown by HVPE on the Ga-polar side main surface of the c-plane GaN wafer.

For reference, for GaN grown by hydride vapor phase epitaxy (HVPE), an absorption peak having an absorption coefficient of more than 0.5 $cm^{-1}$ is not observed in a range of 3150 to 3250 $cm^{-1}$ of an infrared absorption spectrum. Thus, GaN grown by HVPE can be distinguished from GaN grown by an ammonothermal method. This infrared absorption peak relates to gallium vacancies contained at high concentration in GaN grown by an ammonothermal method [S. Suihkonen, et al., Applied Physics Letters 108, 202105 (2016); W. Jiang, et al., Applied Physics Express 10, 075506 (2017)].

In the GaN substrate 20 illustrated in FIG. 5, the room temperature resistivity in the first region $R_1$ may be less than 0.03 Ω·cm, less than 0.02 Ω·cm, less than 0.015 Ω·cm, or less than 0.010 Ω·cm. The carrier concentration at room temperature in the first region $R_1$ is preferably $1\times10^{18}$ $cm^{-3}$ or more and more preferably $2\times10^{18}$ $cm^{-3}$ or more, and may be $3\times10^{18}$ $cm^{-3}$ or more, or even $4\times10^{18}$ $cm^{-3}$ or more.

The intentional dopant contained in the first region $R_1$ is a donor impurity, and in this case, the donor impurity contained at the highest concentration in the first region $R_1$ is preferably Ge. In a suitable example, in the first region $R_1$, the total concentration of donor impurities excluding Ge may be 10% or less, even 5% or less, or even 1% or less of the Ge concentration.

In the second region $R_2$, the Si concentration may be $5\times10^{17}$ atoms/$cm^3$ or less, the O concentration may be $3\times10^{16}$ atoms/$cm^3$ or less, $2\times10^{16}$ atoms/$cm^3$ or less, or $1\times10^{16}$ atoms/$cm^3$ or less, and the concentration of each impurity excluding Si, O, and H may be $5\times10^{15}$ atoms/$cm^3$ or less.

In the second region $R_2$, the carrier concentration may be less than $5\times10^{17}$, as well as the room temperature resistivity may be 0.04 Ω·cm or more.

Figure 6:
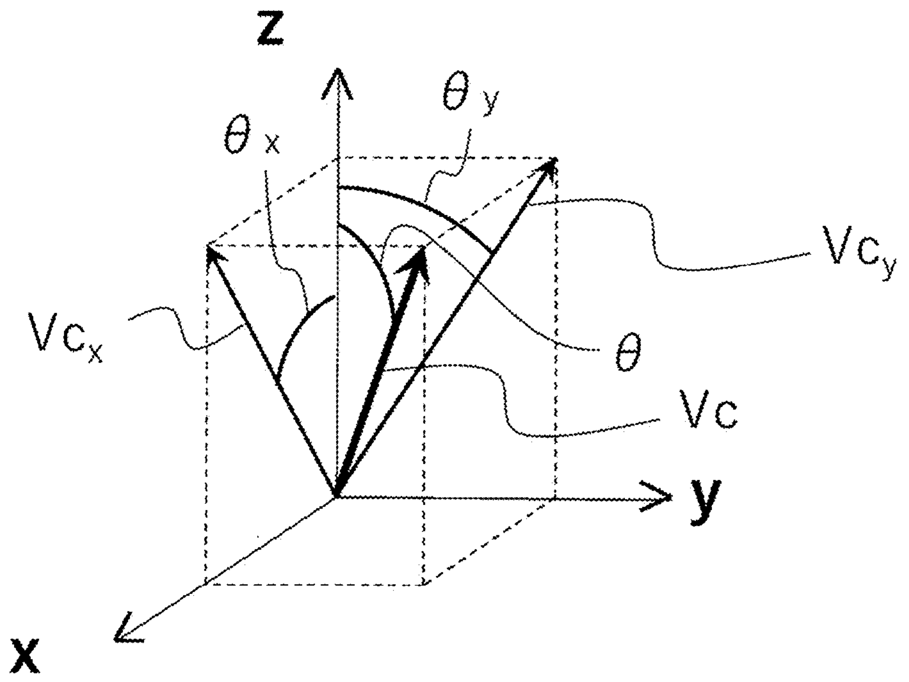
FIG. 6 is a diagram illustrating that the offcut angle of a c-plane GaN substrate can be resolved into components in two directions perpendicular to each other.

The offcut angle of the n-type GaN substrate according to the present embodiment can be resolved into components in two directions orthogonal to each other in the main surface, that is, an x-direction component and a y-direction component. Referring to FIG. 6, when the normal direction of the first main surface 21 is defined as the z-direction and a vector parallel to the c-axis is defined as a vector Vc, the offcut angle of the wafer 20 is equal to the tilt angle θ of the vector Vc from the z-axis. This vector Vc can be decomposed into a vector $Vc_x$ that is an x-direction component and a vector $Vc_y$ that is a y-direction component. An orthogonal projection of the vector Vc on the xz plane is a vector $Vc_x$, and an orthogonal projection of the vector Vc on the yz plane is a vector $Vc_y$.

When the vector Vc is thus resolved, the tilt angle of the vector $Vc_x$ from the z-axis is the x-direction component $\theta_x$ of the offcut angle θ, and the tilt angle of the vector $Vc_y$ from the z-axis is the y-direction component $\theta_y$ of the offcut angle θ.

In the n-type GaN substrate according to the present embodiment, the variation range of the x-direction component of the offcut angle on a line passing through the center of at least one of the two main surfaces and extending in the x-direction, and the variation range of the y-direction component of the offcut angle on a line passing through the center of the same main surface and extending in the y-direction can each be 0.15 degrees or less, preferably 0.1 degrees or less, and more preferably 0.08 degrees or less in the section having a length of 40 mm. In this evaluation, a portion at a distance of less than 5 mm from the outer periphery in plan view of the GaN substrate may be excluded.

The variation range is a difference between the maximum value and the minimum value. For example, a variation range of 0.15 degrees or less is, in other words, that the variation from the median is within ±0.075 degrees.

The x-direction may be parallel to one of the a-planes, and in this case, the y-direction is parallel to one of the m-planes.

The edge of the n-type GaN substrate according to the present embodiment may be chamfered.

The n-type GaN substrate according to the present embodiment may be provided with various types of markings as necessary, such as an orientation flat (OF) indicating the orientation of the crystal, a notch, and an index flat for facilitating the identification of the front surface and the back surface.

Although the main surface of the n-type GaN substrate according to the present embodiment has a circular shape, the shape is not limited to a circle and may be changed to a square, a rectangle, a hexagon, an octagon, or any other shape.

In the n-type GaN substrate according to the present embodiment or at least a high carrier concentration region (e.g., the first region $R_1$ in the example illustrated in FIG. 5) of the n-type GaN substrate according to the present embodiment, the lower limit of the total concentration of donor impurities may be $2\times10^{18}$ atoms/cm$^3$ or more, $4\times10^{18}$ atoms/cm$^3$ or more, or $6\times10^{18}$ atoms/cm$^3$ or more. The upper limit of the total concentration of donor impurities may be $5\times10^{19}$ atoms/cm$^3$ or less, even $2\times10^{19}$ atoms/cm$^3$ or less, or even $1\times10^{19}$ atoms/cm$^3$ or less for avoiding a significant decrease in crystal quality.

In the n-type GaN substrate according to the present embodiment or its high carrier concentration region, the variation in carrier concentration in the c-axis direction is preferably within ±25%, more preferably within ±20%, even more preferably within ±15%, and still more preferably within ±10% from the median. In the case where the carrier concentration is difficult to measure, the total concentration of donor impurities may be used in place of the carrier concentration.

The room temperature resistivity of the n-type GaN substrate according to the present embodiment or its high carrier concentration region may be less than 0.03 Ω·cm, less than 0.02 Ω·cm, less than 0.015 Ω·cm, or less than 0.010 Ω·cm. The carrier concentration at room temperature is preferably $1\times10^{18}$ cm$^{-3}$ or more and more preferably $2\times10^{18}$ cm$^{-3}$ or more, and may be $3\times10^{18}$ cm$^{-3}$ or more or even $4\times10^{18}$ cm$^{-3}$ or more.

The n-type GaN substrate according to the present embodiment or its high carrier concentration region preferably satisfies one or more conditions selected from (a) to (c) below regarding the impurity concentration.

(a) Si concentration is $5\times10^{16}$ atoms/cm$^3$ or more.

(b) O concentration is $3\times10^{16}$ atoms/cm$^3$ or less.

(c) H concentration is $1\times10^{17}$ atoms/cm$^3$ or less.

The dislocation density in at least one main surface of the n-type GaN substrate according to the present embodiment can be preferably $5\times10^5$ cm$^{-2}$ or less, more preferably $2\times10^5$ cm$^{-2}$ or less, even more preferably $1\times10^5$ cm$^{-2}$ or less, and particularly preferably $5\times10^4$ cm$^{-2}$ or less. In the evaluation of the dislocation density, a portion at a distance of less than 5 mm from the outer periphery in plan view of the GaN substrate may be excluded. The dislocation density is measured as follows. Specifically, a position 8 mm away from the center of the substrate is defined as the center of the measurement, and in a PL image, the number of dark spots in a region within 4 mm×4 mm is counted. The dislocation density is determined by dividing the number of counted spots by the measured area.

The crystal quality of the GaN substrate can be evaluated using, as an index, a (004) XRD rocking curve FWHM measured by ω scan using CuK$\alpha_1$ radiation. The GaN substrate having better crystal quality exhibits a narrower (004) XRD rocking curve FWHM.

In the (004) XRD rocking curve measurement, an X-ray tube is operated at a voltage of 45 kV and a current of 40 mA, and CuK$_\alpha$ rays monochromated using a Ge (440) symmetric four-crystal monochromator are allowed to be incident on the first main surface 21.

The X-ray beam size is set so that the size of the irradiation area on the main surface is 5 mm in the direction parallel to the ω-axis and 1 mm in the direction perpendicular to the ω-axis when the incident angle (the angle formed by the reflecting surface and the X-ray) is 90 degrees, that is, when the X-ray is allowed to be incident perpendicularly on the (004) plane, which is the reflecting surface. The ω-axis is a rotation axis of the sample in the rocking curve measurement.

When the X-ray beam size is set as described above, ω is about 36.5° in the (004) XRD rocking curve measurement of GaN, and thus the irradiation area on the main surface is about 1.7×5 mm$^2$.

In the n-type GaN substrate according to the present embodiment, when a first line segment having a length of 40 mm is defined on at least one main surface and ω scan is performed every 1 mm over a length of 40 mm along the first line segment to obtain a (004) XRD rocking curve at 40 measurement points arranged at 1-mm pitch on the first line segment, the maximum value of the (004) XRD rocking curve FWHM at all the measurement points is preferably 30 arcsec or less. In addition, the average value of the (004) XRD rocking curve FWHM at all the measurement points may be 20 arcsec or less, 18 arcsec or less, even 16 arcsec or less, even 14 arcsec or less, even 12 arcsec or less, or even 10 arcsec or less.

Figure 7:
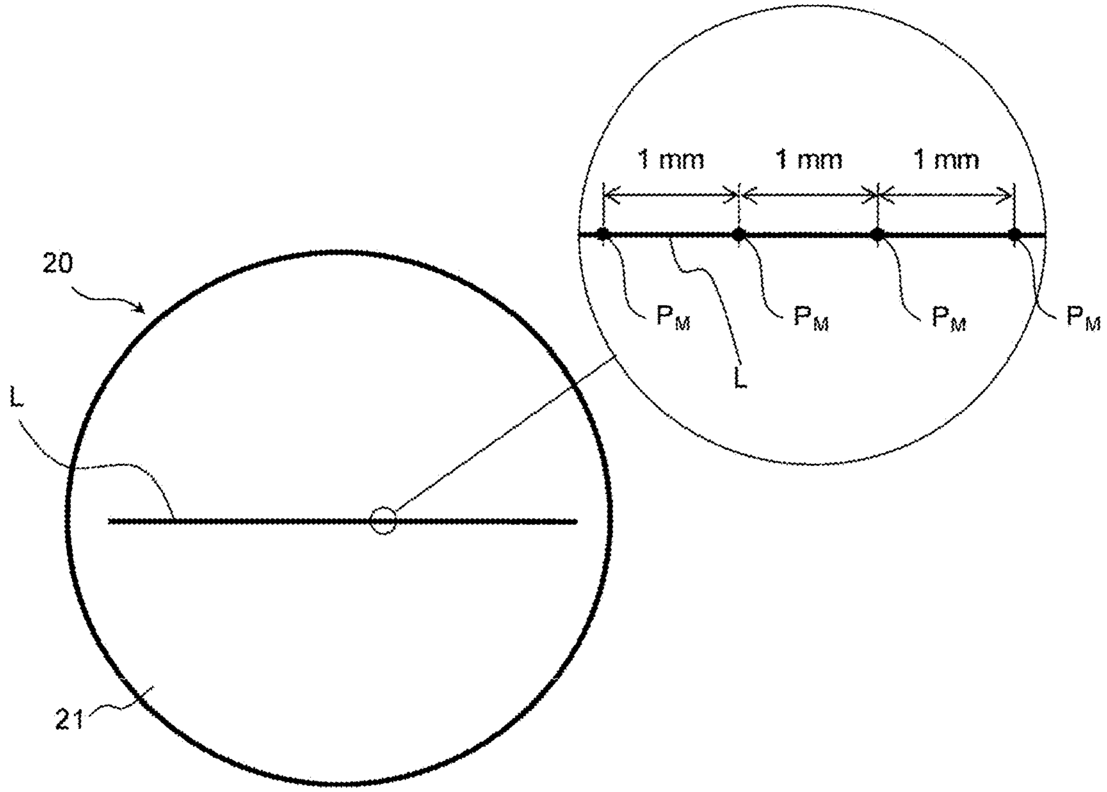
FIG. 7 is a plan view illustrating an n-type GaN substrate according to an embodiment.

A specific example is illustrated in FIG. 7. When ω scan is performed every 1 mm over a length of 40 mm along one line L on the first main surface 21 of the GaN substrate 20, a (004) XRD rocking curve can be obtained at 40 measurement points $P_M$ arranged at 1-mm pitch on the line L. In the ω scan at each measurement point $P_M$, the ω-axis is perpendicular to the line L. In other words, X-ray is allowed to be incident on the GaN substrate 20 so that the X-ray incident surface is parallel to the line L.

In the n-type GaN substrate according to the present embodiment, when a second line segment having a length of 40 mm perpendicular to the first line segment is further defined in addition to the first line segment on at least one main surface and ω scan is performed every 1 mm over a length of 40 mm along the second line segment to obtain a (004) XRD rocking curve at 40 measurement points arranged at 1-mm pitch on the second line segment, the maximum of the values at the 40 measurement points on one of the two line segments and the maximum of the values at the 40 measurement points on the other line segment can each be 20 arcsec or less. In addition, the average value of the (004) XRD rocking curve FWHM at all the measurement points of the first line segment and the second line segment may be 18 arcsec or less, even 16 arcsec or less, even 14 arcsec or less, even 12 arcsec or less, or even 10 arcsec or less.

Figure 8:
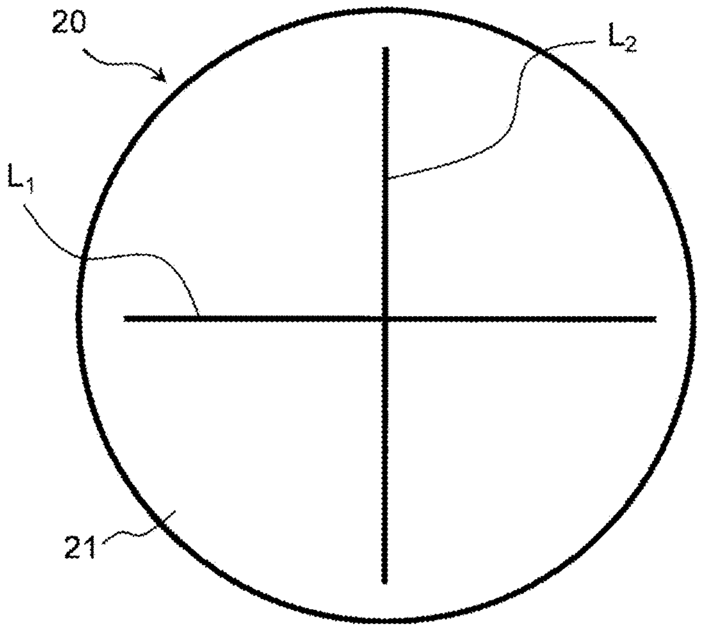
FIG. 8 is a plan view illustrating an n-type GaN substrate according to an embodiment.

A specific example is illustrated in FIG. 8. When ω scan is performed every 1 mm over a length of 40 mm along each of two lines $L_1$ and $L_2$ perpendicular to each other on the first main surface 21 of the GaN substrate 20, a (004) XRD rocking curve can be obtained at 40 measurement points arranged at 1-mm pitch on each of the lines $L_1$ and $L_2$. In this case, the ω-axis is perpendicular to the line $L_1$ in the ω scan at each measurement point on the line $L_1$, and the ω-axis is perpendicular to the line $L_2$ in the ω scan at each measurement point on the line $L_2$.

2. Application

The n-type GaN substrate according to the present embodiment can be preferably used as a substrate for producing various nitride semiconductor devices.

The nitride semiconductor device is a semiconductor device in which the main part of the device structure is formed of a nitride semiconductor. The nitride semiconductor is also referred to as a nitride-based group III-V compound semiconductor, a group III nitride-based compound semiconductor, a GaN-based semiconductor, or the like, and includes GaN and also includes a compound in which gallium of GaN is partially or entirely replaced by another group 13 element (such as B, Al, or In) of the periodic table.

Representative examples of the nitride semiconductor device that can be produced using the n-type GaN substrate according to the present embodiment include, but are not limited to, light-emitting devices, such as a light-emitting diode (LED) and a laser diode (LD); and electronic devices, such as a rectifier, a bipolar transistor, a field-effect transistor, and a high electron mobility transistor (HEMT).

3. Method for Growing GaN Crystal

Next will be described a method for growing a GaN crystal that can be preferably used for producing the n-type GaN substrate according to the present embodiment. For the production method, reference can be made to WO 2020/036047.

3.1. HVPE Apparatus

Figure 9:
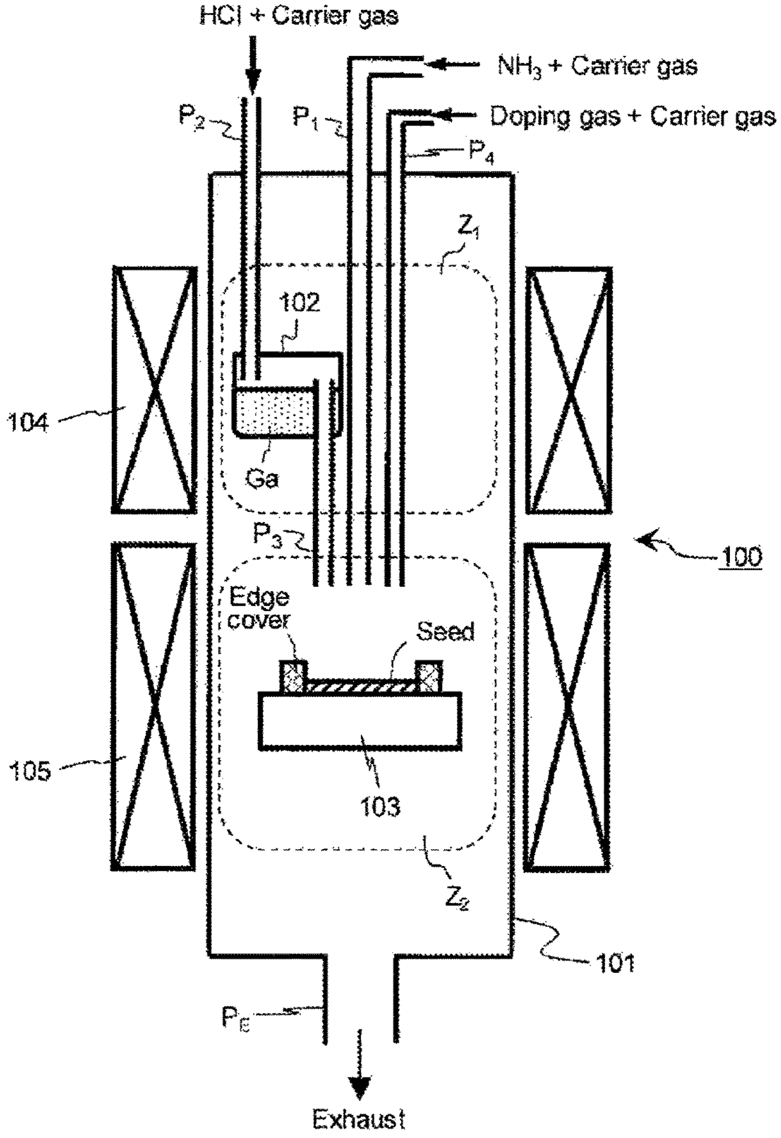
FIG. 9 is a schematic view illustrating a basic configuration of an HVPE apparatus.

FIG. 9 illustrates the basic configuration of an HVPE apparatus that can be used for producing the n-type GaN substrate according to the present embodiment.

With reference to FIG. 9, an HVPE apparatus 100 includes a hot wall type reactor 101, a gallium reservoir 102 and a susceptor 103 placed in the reactor, and a first heater 104 and a second heater 105 placed outside the reactor. The first heater 104 and the second heater 105 each annularly surround the reactor 101.

The reactor 101 is a quartz tube chamber. The reactor 101 has, in its inside, a first zone $Z_1$ to be heated mainly by the first heater 104 and a second zone $Z_2$ to be heated mainly by the second heater 105. An exhaust pipe $P_E$ is connected to a reactor end on the second zone $Z_2$ side.

The gallium reservoir 102 placed in the first zone $Z_1$ is a quartz vessel having a gas inlet and a gas outlet.

The susceptor 103 placed in the second zone $Z_2$ is formed of, for example, graphite. A mechanism for rotating the susceptor 103 can be optionally provided.

A seed is placed on the susceptor 103.

Figure 10:
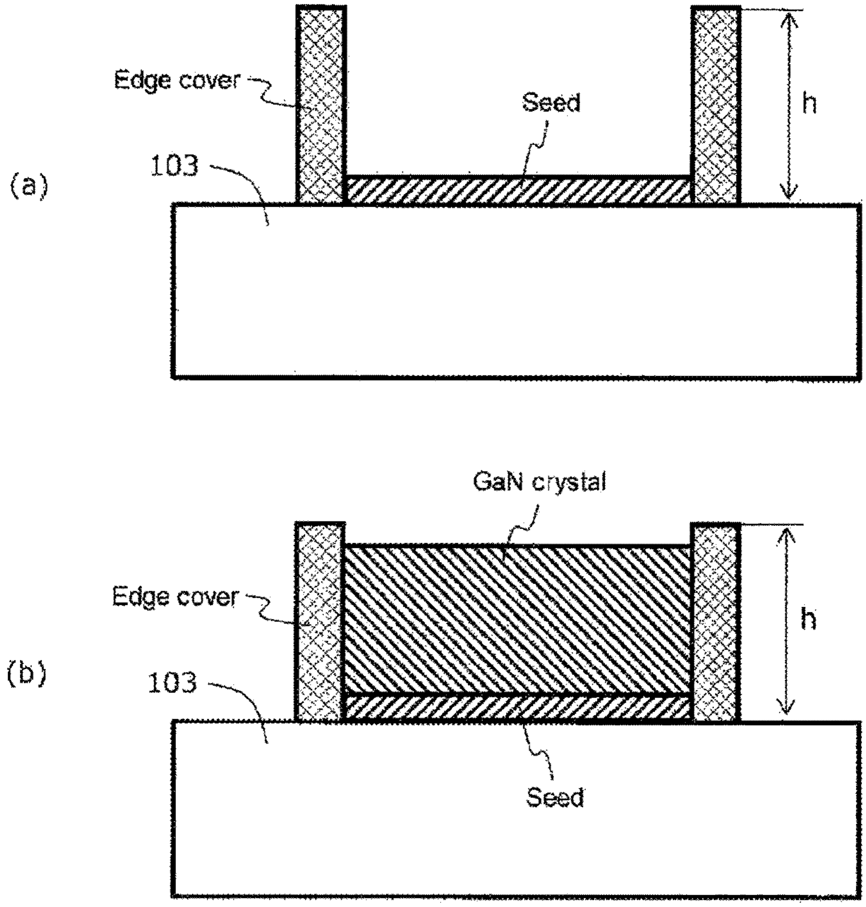
FIG. 10(*a*) is a cross-sectional view illustrating a state where a seed and an edge cover are set on a susceptor.

Preferably, as illustrated in FIG. 10(*a*), an edge cover covering the edge of the seed is placed on the susceptor together with the seed.

The edge cover is formed, for example, of graphite. As illustrated in FIG. 10(*b*), the height h of the edge cover is set so that the position of the upper surface of a GaN thick film grown on the seed is not higher than the upper end of the edge cover when the growth of the thick film is completed.

Figure 11:
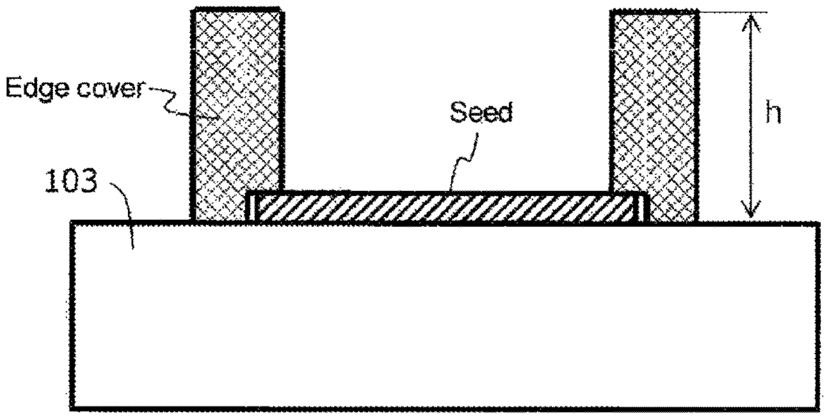
FIG. 11 is a cross-sectional view illustrating a state where a seed and an edge cover are set on a susceptor.

As illustrated in FIG. 11, the edge cover may cover an outer peripheral portion of the main surface of the seed in addition to the edge of the seed.

When a GaN crystal thick film is grown on a large-area seed, an edge cover is preferably used.

Referring back to FIG. 9, when a GaN crystal is grown, the inside of the reactor 101 is heated by the first heater 104 and the second heater 105, $NH_3$ (ammonia) diluted with a carrier gas is supplied to the second zone $Z_2$ through an ammonia inlet pipe $P_1$, and HCl (hydrogen chloride) diluted with a carrier gas is supplied to the gallium reservoir 102 through a hydrogen chloride inlet pipe $P_2$. The HCl reacts with metallic gallium in the gallium reservoir 102, and the resulting GaCl (gallium chloride) is carried to the second zone $Z_2$ through a gallium chloride inlet pipe $P_3$. In the second zone $Z_2$, $NH_3$ reacts with GaCl, and the resulting GaN crystallizes on the seed placed on the susceptor 103.

When the GaN crystal growing on the seed is doped with an impurity, a doping gas diluted with a carrier gas is introduced to the second zone $Z_2$ in the reactor 101 through a dopant inlet pipe $P_4$.

Regarding each of the ammonia inlet pipe $P_1$, the hydrogen chloride inlet pipe $P_2$, the gallium chloride inlet pipe $P_3$, and the dopant inlet pipe $P_4$, a portion placed in the reactor 101 can be formed of quartz.

In FIG. 9, the distance between the susceptor 103 and the nozzle of the ammonia inlet pipe $P_1$ is the same as the distance between the susceptor 103 and the nozzle of the gallium chloride inlet pipe $P_3$. However, the configuration is not limited to this, and the nozzle of the ammonia inlet pipe $P_1$ may be opened at a position more distant (upstream) from the susceptor 103 than the nozzle of the gallium chloride inlet pipe $P_3$.

Alternatively, the nozzle of the ammonia inlet pipe $P_1$ and the nozzle of the gallium chloride inlet pipe $P_3$, which are independent in FIG. 9, may be integrated to form a double pipe nozzle in which the former is an outer pipe and the latter is an inner pipe.

In FIG. 9, the nozzles of the gallium chloride inlet pipe $P_3$ and the dopant inlet pipe $P_4$ are illustrated as independent nozzles, but the configuration is not limited to this. For example, for homogeneous doping of the growing GaN crystal, the nozzle of the dopant inlet pipe $P_4$ may be opened in the gallium chloride inlet pipe $P_3$ so that GaCl and the doping gas are mixed and then discharged into the second zone $Z_2$ through a common nozzle.

When the growing GaN crystal is doped with Ge, $GeH_4$ (germane), $GeH_3Cl$ (monochlorogermane), $GeH_2Cl_2$ (dichlorogermane), $GeHCl_3$ (trichlorogermane), or $GeCl_4$ (tetrachlorogermane) can be preferably used as the doping gas.

The growing GaN crystal may contain O and Si even though the crystal is not intentionally doped. The unintended Si is probably derived from quartz constituting the reactor or piping, and the unintended O is probably derived from either or both of the quartz and moisture entering the reactor from the outside.

For components to be placed in the reactor 101, including those omitted in FIG. 9, a component formed of SiC (silicon carbide), $SiN_x$ (silicon nitride), BN (boron nitride), alumina, W (tungsten), Mo (molybdenum), or the like can be used in addition to a component formed of quartz or carbon. By doing so, the concentration of each impurity (excluding Si, O, and H) in the GaN crystal growing on the seed can be $5\times10^{15}$ atoms/cm$^3$ or less unless the crystal is intentionally doped.

3.2. Seed

A suitable example of the seed used for the growth of the GaN crystal in the production of the n-type GaN substrate according to the present embodiment is a c-plane GaN wafer grown by an acidic ammonothermal method using $NH_4F$ and $NH_4I$ as mineralizers. For its production method, reference can be made to WO 2018/030311.

Although the c-plane GaN wafer often has an oxygen concentration of the order of mid-$10^{18}$ atoms/cm$^3$ or more, a GaN crystal having an oxygen concentration of $3\times10^{16}$ atoms/cm$^3$ or less can be grown on the main surface on the Ga-polar side by HVPE with almost no occurrence of strain.

The tilt angle of the main surface to the (0001) crystal plane (which may be referred to as an "off-angle" in the present specification) is preferably 0±0.1 degrees, more preferably 0±0.05 degrees, and particularly preferably 0±0.01 degrees. The present inventors have found that when the off-angle is in the above range, an in-plane variation in carrier concentration can be reduced. This is probably because when the off-angle is in the above range, formation of a plurality of hillocks can be suppressed on the main surface, whereby the boundary region between the hillocks can be reduced. Although setting an off-angle of, for example, 0.3 degrees or more in a substrate used as a seed for epitaxial growth of a GaN crystal has been common knowledge of those skilled in the art (e.g., JP 2019-151518 A), the present inventors have found that even when a substrate having an off-angle of 0±0.1 degrees is used as a seed, the crystal can be grown by HVPE, and an in-plane variation in carrier concentration can be reduced. The off-angle can be adjusted by the angle at which the substrate is cut out.

Meanwhile, the off-angle of the main surface is also preferably 0.5 degrees or more. The present inventors have found that even when the off-angle is in the above range, an in-plane variation in carrier concentration can be reduced. The reason for this is still unclear, but the present inventors consider the reason as follows.

Doping with Ge at a relatively high concentration increases an in-plane variation in carrier concentration. One of the causes for this is probably plane-orientation dependence of the incorporation amount of Ge. Epitaxial growth using the c-plane GaN substrate as a seed forms a hillock. The hillock mainly originates from the screw dislocation and has a substantially hexagonal pyramid shape, and this shape strongly correlates with the off-angle of the underlying substrate. When the off-angle is 0±0.1 degrees, a regular hexagonal pyramidal hillock is formed. Since all crystal planes formed in the hexagonal pyramid are equivalent planes, the incorporation amount of Ge is uniform, and the in-plane variation is reduced. Meanwhile, when the off-angle increases, the hillock is tilted in the off-direction, and the formed planes are not equivalent to each other. Along with this, in-plane variation in the incorporation of Ge begins to manifest. However, when the off-angle exceeds a certain value, the hillock disappears. With the disappearance of the hillock, equivalent planes are formed again on the crystal surface. This probably enables uniform doping with Ge.

3.3. Growth Conditions

Preferred conditions for growth of the GaN crystal on the seed by HVPE are as follows.

The temperature of the gallium reservoir is, for example, from 500 to 1000° C. and preferably 700° C. or higher, and preferably 900° C. or lower.

The susceptor temperature is, for example, from 900 to 1100° C., preferably 930° C. or higher and more preferably 950° C. or higher, and preferably 1050° C. or lower and more preferably 1020° C. or lower.

A V/III ratio, which is the ratio of the $NH_3$ partial pressure to the GaCl partial pressure in the reactor, can be, for example, from 1 to 20 and is preferably 2 or more and more preferably 3 or more, and preferably 10 or less.

An excessively high or low V/III ratio would cause deterioration of the surface morphology of the growing GaN. The deterioration of the surface morphology would cause a decrease in crystal quality and an increase in the concentration of oxygen unintentionally incorporated into the GaN crystal.

The incorporation efficiency of a certain type of impurity into the GaN crystal strongly depends on the orientation of the facet exposed on the growing GaN surface. The concentration of such an impurity is distributed less uniformly in the interior of the GaN crystal with poor surface morphology during growth. This is due to the presence of facets of various orientations on the surface with poor morphology.

A typical example of such an impurity is O (oxygen), but the present inventors have found that Ge (germanium) also has a similar tendency. This is related to that the molar ratio of $H_2$ in the carrier gas should not be excessively reduced when a GaN crystal intentionally doped with Ge is grown as will be described below.

In addition, the use of an excessively low V/III ratio would increase the nitrogen vacancy concentration of the growing GaN crystal. The effect of the nitrogen vacancy on the GaN wafer or the nitride semiconductor device formed on the GaN wafer is not yet clear. However, the nitrogen vacancy is a point defect, and thus it is considered that its concentration should be reduced as much as possible.

The growth rate of the GaN crystal can be controlled using, as a parameter, the product of the $NH_3$ partial pressure and the GaCl partial pressure in the reactor. The rate is, for example, from 20 to 200 μm/h, preferably 30 μm/h or more and more preferably 40 μm/h or more, and preferably 120 μm/h or less, more preferably 100 μm/h or less, and even more preferably 80 μm/h or less.

When the GaN crystal is grown by HVPE on a seed having high crystal quality composed of a GaN crystal grown by an acidic ammonothermal method, a growth rate of 20 μm/h to 50 μm/h is preferably employed at the initial stage of the crystal growth. This is because generation of new threading dislocations can be prevented at the interface between the seed composed of the GaN crystal grown by the acidic ammonothermal method and the GaN crystal growing on the seed by HVPE.

To increase the production efficiency, the growth rate may be increased during the growth. For example, the initial growth rate may be 40 μm/h, and the growth rate may be increased to 80 μm/h to 120 μm/h during the growth. The threading dislocation density of the GaN crystal grown at 80 μm/h is not different from that of a seed composed of a GaN crystal grown by an acidic ammonothermal method, and the threading dislocation density of the GaN crystal grown at 120 μm/h is at most twice that of such a seed.

When the growth rate is increased, it should be increased within such a range that the surface morphology of the growing GaN crystal does not deteriorate. The problems that can occur with the deterioration of the surface morphology are as described above.

The carrier gas that can be used for diluting each of $NH_3$, HCl, and the doping gas is preferably $H_2$ (hydrogen gas), $N_2$ (nitrogen gas), or a mixed gas of $H_2$ and $N_2$.

The molar ratio of $H_2$ in the carrier gas affects the impurity concentration of the growing GaN crystal. The molar ratio of $H_2$ in the carrier gas referred to herein is calculated based on the flow rate of each gas species supplied as the carrier gas from the outside of the reactor into the reactor.

4. n-type Gan Crystal

Another embodiment of the present invention relates to an n-type GaN crystal.

The n-type GaN crystal is doped with Ge as a donor impurity, has two main surfaces, and has an average carrier concentration of $1\times10^{18}$ $cm^{-3}$ or more, wherein when 10 sub-square regions of 2 mm×2 mm are randomly selected on at least one of the two main surfaces, an average of 10 root-mean-square roughnesses measured at the respective 10 sub-square regions is 1 μm or less.

The n-type GaN crystal described above is doped with Ge, has a relatively high carrier concentration, and has a small surface roughness of the main surface of the crystal. As a result of studies by the present inventors, it has been found that when an n-type GaN crystal having a relatively high carrier concentration is to be produced by doping with Ge as a donor impurity for obtaining an n-type GaN substrate having lower resistance, a variation in carrier concentration occurs on the main surface of the resulting n-type GaN crystal. The present inventors consider that the roughness of the crystal surface is one of the factors affecting the variation. The present inventors have found that in the case of widely used Si doping, the presence of the same degree of surface roughness does not cause a variation in carrier concentration, but in the case of Ge doping, even a slight roughness greatly affects the amount of incorporation. An n-type substrate produced by slicing such a crystal has a large in-plane variation in carrier concentration, which adversely affects device characteristics, such as a variation in resistance between chips when a device is produced using the n-type substrate.

In the n-type GaN crystal described above, when 10 sub-square regions of 2 mm×2 mm are randomly selected on the main surface, the average of 10 root-mean-square (RMS) roughnesses measured at the respective 10 sub-square regions is 1 μm or less. Thus, the surface roughness is reduced, and an n-type GaN substrate having a reduced variation in carrier concentration is produced. From this viewpoint, the average of 10 RMS roughnesses measured at the respective 10 sub-square regions is preferably 0.8 μm or less, more preferably 0.6 μm or less, and even more preferably 0.5 μm or less. Herein, the RMS roughness is a value measured with a confocal laser microscope.

The n-type GaN crystal described above can be produced, for example, by setting the off-angle of the seed to 0.5 degrees or more in the method for producing the GaN crystal described above.

In the n-type GaN crystal described above, the main surface including the sub-square regions is preferably not planarized.

EXAMPLES

The present invention will be specifically described with reference to Examples below, but the present invention is not limited to these Examples.

Figure 12:
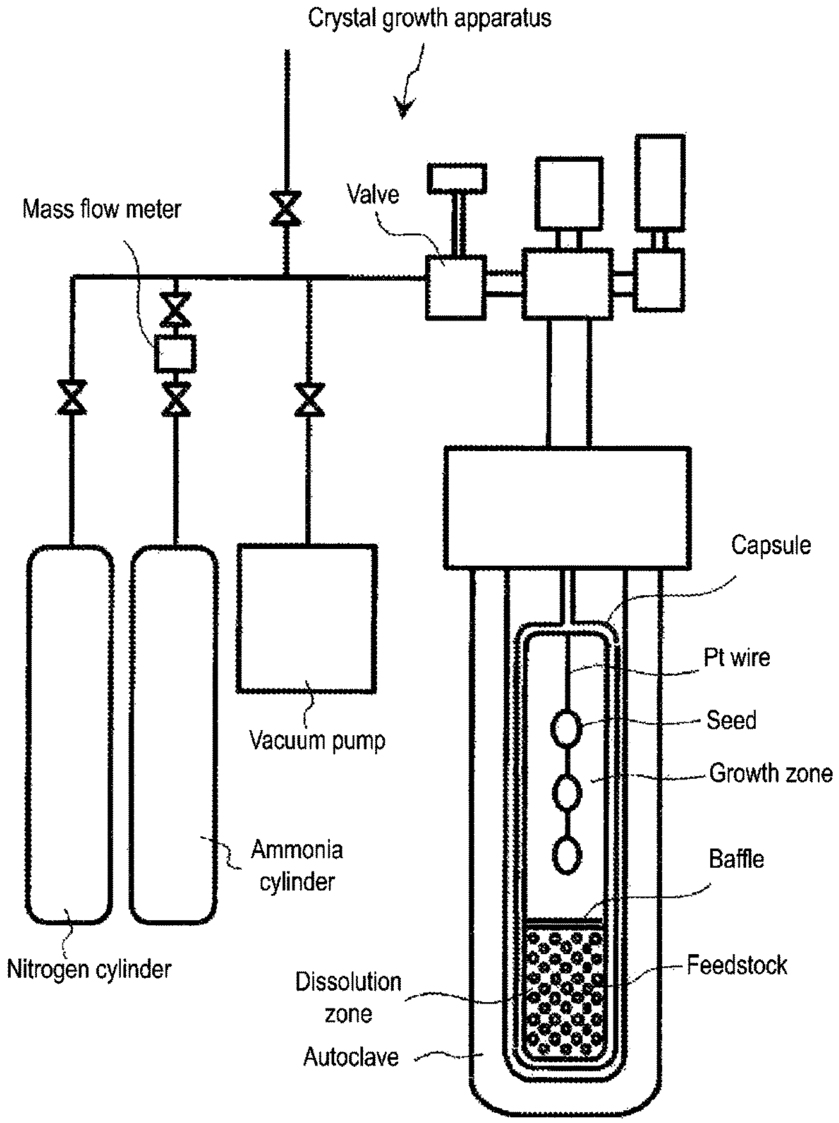
FIG. 12 is a diagram illustrating a basic configuration of a crystal growth apparatus used for growing a GaN crystal by an ammonothermal method.

In experiments, a crystal growth apparatus having a basic configuration illustrated in FIG. 12 was used for growing a GaN crystal by an ammonothermal method. This crystal growth apparatus includes an autoclave and a Pt—Ir alloy-made capsule placed in the autoclave. The capsule has in its interior a dissolution zone and a growth zone separated from each other by a baffle made of Pt. When a GaN crystal is grown, a feedstock is placed together with a mineralizer (not illustrated) in the dissolution zone and a seed is suspended with a Pt wire in the growth zone.

A gas line to which a vacuum pump, an ammonia cylinder, and a nitrogen cylinder are connected is connected to the autoclave and the capsule via a valve. When $NH_3$ (ammonia) is introduced into the capsule, the amount of $NH_3$ supplied from the ammonia cylinder can be checked with a mass flow meter.

The pressure in the capsule when the capsule is heated to a given temperature is determined depending on the amount of $NH_3$ introduced into the capsule. $NH_3$ is encapsulated not only in the capsule but also in the space between the autoclave and the capsule so that the pressures inside and outside the capsule are balanced.

Once the seed, feedstock, and mineralizer are placed and the introduction of $NH_3$ is completed, the capsule is sealed and heated with a heater (not illustrated) from outside the autoclave so that the interior is in a supercritical state. To provide a temperature gradient between the dissolution zone and the growth zone, the upper and lower parts of the autoclave are separately heated with a plurality of heaters.

1. Example 1

(1) Preparation of Seed

Firstly, a first c-plane GaN wafer having a thickness of 0.4 mm grown by an ammonothermal method using $NH_4F$ and $NH_4I$ as mineralizers was prepared.

On a mirror-finished N-polar surface of the first c-plane GaN wafer, a selective growth mask having a stripe pattern was formed using a lift-off method. The selective growth mask was composed of a sputtered film having a two-layer structure in which a 100-nm thick Pt surface layer was laminated on a 100-nm thick TiW underlayer. The line width of linear openings provided in the selective growth mask was 50 μm, and the pitch between the linear openings was 2 mm. The stripe direction was parallel to the a-plane of the GaN crystal constituting the wafer.

A GaN crystal was grown by an ammonothermal method using, as a seed, the first c-plane GaN wafer having the selective growth mask formed on the N-polar surface.

In the ammonothermal process, polycrystalline GaN was used as a feedstock, and $NH_4F$ and $NH_4I$ were used as mineralizers.

The polycrystalline GaN was produced by a method of bringing HCl gas into contact with elemental Ga under heating to generate gaseous GaCl and reacting the gaseous GaCl with $NH_3$ gas.

The amount of the mineralizer charged was 1.0% in terms of a molar ratio to the $NH_3$ solvent for each of $NH_4F$ and $NH_4I$. The $NH_4I$ mineralizer was synthesized by reacting HI (hydrogen iodide) gas with $NH_3$ in the Pt—Ir capsule used as the reaction vessel.

In the ammonothermal process, the average of the temperature $T_1$ of the dissolution zone and the temperature $T_2$ of the growth zone was between 600° C. and 620° C., the temperature difference between the two zones $T_1-T_2$ ($T_1>T_2$) was between 5° C. and 10° C., and the pressure in the capsule was between 200 MPa and 230 MPa. These conditions were maintained for 30 days or more.

Figure 13:
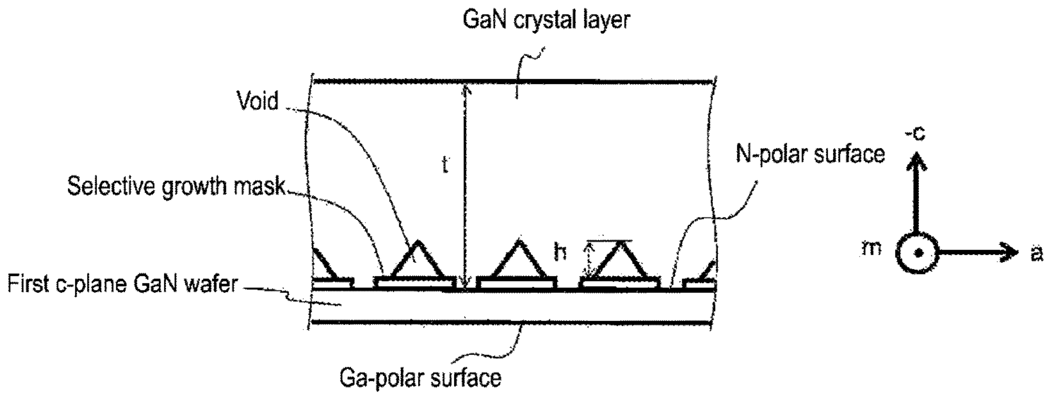
FIG. 13 is a cross-sectional view illustrating a state where a GaN crystal layer is grown on an N-polar surface of a first c-plane GaN wafer by an ammonothermal method.

As illustrated in FIG. 13, the GaN crystal was grown so as to form a layer on the N-polar surface of the first c-plane GaN wafer. The thickness t of the layer was 3 mm. A void was formed at a portion adjacent to the selective growth mask, and the height h of the void, that is, the distance from the upper surface of the selective growth mask to the upper end of the void was between 0.5 mm and 1 mm. Note that the GaN crystal was also grown on the Ga-polar surface of the first c-plane GaN wafer, but the illustration is omitted in FIG. 13.

Subsequently, the grown GaN crystal layer was processed to form a second c-plane GaN wafer having a thickness of 0.4 mm. The Ga-polar surface of the second c-plane GaN wafer was planarized to mirror-surface by polishing and then finished by CMP to remove a damaged layer. The off-angle of the Ga-polar surface of the second c-plane GaN wafer was set to 0 degrees from the (0001) plane.

(2) Production of Ge-Doped c-Plane GaN Substrate

A c-plane GaN wafer having a Ga-polar surface area of about 7 $cm^2$ and a thickness of 0.4 mm obtained by dividing the second c-plane GaN wafer was used as a seed, and a GaN thick film was grown on the Ga-polar surface by HVPE using a vapor phase growth apparatus having the same basic configuration as that of the HVPE apparatus illustrated in FIG. 9. The procedure was generally as described below.

Firstly, the seed was set on the susceptor. An edge cover was used.

Then, while $N_2$, $H_2$, and $NH_3$ were supplied into the reactor so that the partial pressures were 0.30 atm, 0.65 atm, and 0.05 atm, respectively, the reactor was heated with a heater provided outside the reactor.

After the susceptor temperature reached 1005° C., the susceptor temperature was kept constant, and GaN was grown. The temperature of the Ga reservoir was set at 800° C. The carrier gas supplied into the reactor was composed of 38% $H_2$ in molar ratio with $N_2$ as balance.

After the start of the growth, GaCl and $NH_3$ were supplied into the reactor so that the partial pressures were $9.5\times10^{-3}$ atm and $3.8\times10^{-2}$ atm, respectively, and a doping gas was not intentionally supplied for 300 minutes after the start of the growth.

300 minutes after the start of the growth, supply of $GeCl_4$ (tetrachlorogermane) into the reactor was started. The supply rate of $GeCl_4$ was gradually increased over 30 minutes.

A Ge-doped GaN thick film was grown to about 2.6 mm.

The growth rate of the Ge-doped GaN thick film calculated from the thickness and the growth time was about 48 μm/hr.

Subsequently, the Ge-doped GaN thick film was sliced parallel to the c-plane, and the Ga-polar surface of the resulting wafer was subjected to planarization by polishing and subsequent CMP finishing. Slice damage on the N-polar surface side of the wafer was removed by etching. Then, the wafer was cut to thereby complete a Ge-doped c-plane GaN substrate (hereinafter also referred to as "Sample E-1") having a thickness of 335 μm and a main surface area of about 7 $cm^2$.

(3) Evaluation

Carrier Concentration Distribution

Figure 14:
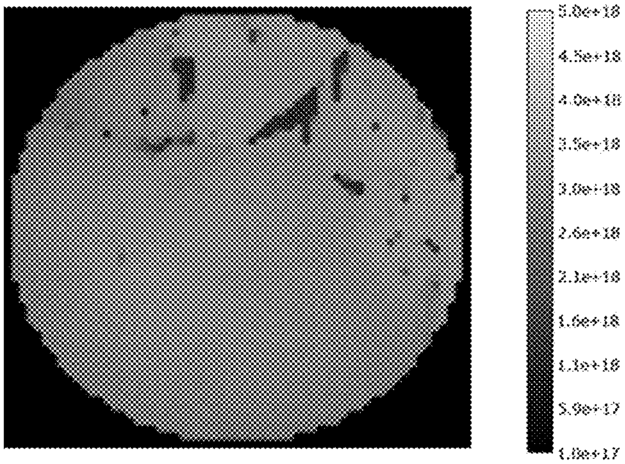
FIG. 14 is a carrier concentration mapping image obtained by Raman spectroscopy of an n-type GaN substrate of Example 1.

Carrier concentrations were measured at 0.5-mm intervals within a region of Φ 30 mm from the center of the main surface on the gallium-polar surface side of Sample E-1 using a Raman spectrometer (HORIBA, Ltd., LabRam HR800), to prepare a carrier concentration mapping image (FIG. 14). The number of data points (measurement points) of the carrier concentration mapping image was 10812. Raman spectroscopy was performed in the vicinity of the surface on the gallium-polar surface side of the substrate.

The average of the carrier concentrations at data points of the carrier concentration mapping image included in a circular region having a radius of 15 mm from the center of the main surface of Sample E-1 was $2.9\times10^{18}$ $cm^{-3}$. The maximum of the carrier concentrations at the data points of the carrier concentration mapping image included in the circular region was $3.3\times10^{18}$ $cm^{-3}$.

The ratio of the number of data points at which the carrier concentration was $2\times10^{18}$ $cm^{-3}$ or more to the total number of the data points (the ratio of the area of a region having a carrier concentration of $2\times10^{18}$ $cm^{-3}$ or more to the area of the circular region having a radius of 15 mm from the center of the main surface) was 97%.

On the carrier concentration mapping image, a total of four line segments having a length of 30 mm, passing through the center of the main surface, and forming angles of 0 degrees, 45 degrees, 90 degrees, and 135 degrees with the OF direction of the substrate were defined, and the average and standard deviation of carrier concentrations at data points of the carrier concentration mapping image corresponding to the points on the line segments were calculated. The calculated average and standard deviation were used to calculate the variation coefficient of carrier concentration (standard deviation/average). The variation coefficient of carrier concentration was 0.06.

On the line segments forming angles of 0 degrees and 90 degrees with the OF direction of the substrate, 59 measurement points at 0.5-mm intervals were the measurement points of the carrier concentration. On the line segments forming angles of 45 degrees and 135 degrees with the OF direction of the substrate, 43 measurement points at intervals of $0.5\times\sqrt{2}$ mm were the measurement points of the carrier concentration.

The ratio of the number of data points at which a measured value was 60% (i.e., $2.0\times10^{18}$ $cm^{-3}$) or less of the maximum of the measured values at all the data points of Sample E-1 to the total number of the data points was 2.6%.

The ratio of the number of data points at which a measured value was 50% (i.e., $1.65\times10^{18}$ $cm^{-3}$) or less of the maximum of the measured values at all the data points of Sample E-1 to the total number of the data points was 2.3%.

The ratio of the number of data points at which a measured value was 40% (i.e., $1.3\times10^{18}$ $cm^{-3}$) or less of the maximum of the measured values at all the data points of Sample E-1 to the total number of the data points was 1.9%.

Dislocation Density

For the main surface on the gallium-polar surface side of the substrate, a position 8 mm away from the center of the substrate was defined as the center of the measurement, and in a PL image, the number of dark spots in a region within 4 mm×4 mm was counted. The dislocation density was calculated from a value obtained by dividing the number of counted spots by the measured area.

As a result, the dislocation density was $3.5\times10^{4}$ $cm^{-2}$.

2. Comparative Example 1

(1) Production of Ge-Doped c-Plane GaN Substrate

A Ge-doped c-plane GaN substrate (hereinafter also referred to as "Sample C-1") was produced in the same manner as in Example 1 except that the off-angle of the Ga-polar surface of the second c-plane GaN wafer was changed to 0.35 degrees from the (0001) plane toward the <1-100> direction; the carrier gas supplied into the reactor after the susceptor temperature reached 1005° C. was composed of 36% $H_2$ in molar ratio with $N_2$ as balance; after the start of growth, GaCl and $NH_3$ were supplied into the reactor so that the partial pressures were $8.6\times10^{-3}$ atm and $3.9\times10^{-2}$ atm, respectively; the partial pressure of Ge supplied was 1.2 times; the Ge-doped GaN thick film was grown to about 2.8 mm; and the growth rate of the Ge-doped GaN thick film calculated from the thickness and the growth time was changed to about 45 μm/hr.

(2) Evaluation

Carrier Concentration Distribution

Figure 15:
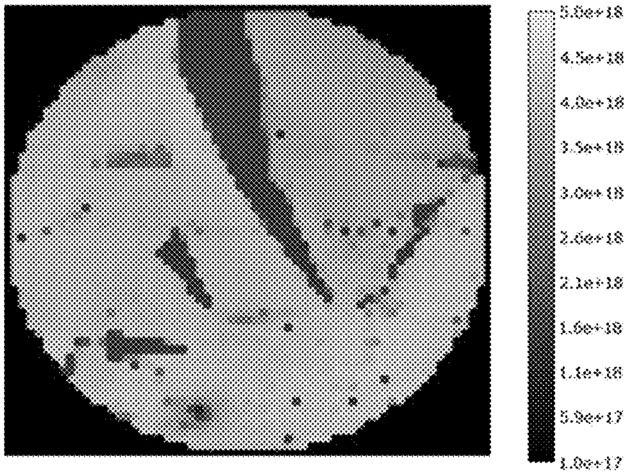
FIG. 15 is a carrier concentration mapping image obtained by Raman spectroscopy of an n-type GaN substrate of Comparative Example 1.

Carrier concentrations were measured at 0.5-mm intervals within a region of Φ 30 mm from the center of the main surface on the gallium-polar surface side of Sample C-1 using a Raman spectrometer (HORIBA, Ltd., LabRam HR800), to prepare a carrier concentration mapping image (FIG. 15). The number of data points of the carrier concentration mapping image was 10812. Raman spectroscopy was performed in the vicinity of the surface on the gallium-polar surface side of the substrate.

The average of the carrier concentrations at data points of the carrier concentration mapping image included in a circular region having a radius of 15 mm from the center of the main surface of Sample C-1 was $3.6\times10^{18}$ $cm^{-3}$. The maximum of the carrier concentrations at the data points of the carrier concentration mapping image included in the circular region was $4.4\times10^{18}$ $cm^{-3}$.

The ratio of the number of data points at which the carrier concentration was $2\times10^{18}$ $cm^{-3}$ or more to the total number of the data points (the ratio of the area of a region having a carrier concentration of $2\times10^{18}$ $cm^{-3}$ or more to the area of the circular region having a radius of 15 mm from the center of the main surface) was 89%.

On the carrier concentration mapping image, a total of four line segments having a length of 30 mm, passing through the center of the main surface, and forming angles of 0 degrees, 45 degrees, 90 degrees, and 135 degrees with the OF direction of the substrate were defined, and the average and standard deviation of carrier concentrations at data points of the carrier concentration mapping image corresponding to the points on the line segments were calculated. The calculated average and standard deviation were used to calculate the variation coefficient of carrier concentration (standard deviation/average). The variation coefficient of carrier concentration was 0.28.

On the line segments forming angles of 0 degrees and 90 degrees with the OF direction of the substrate, 59 measurement points at 0.5-mm intervals were used as the measurement points of the carrier concentration. On the line segments forming angles of 45 degrees and 135 degrees with the OF direction of the substrate, 43 measurement points at intervals of $0.5\times\sqrt{2}$ mm were used as the measurement points of the carrier concentration.

The ratio of the number of data points at which a measured value was 60% (i.e., $2.6\times10^{18}$ $cm^{-3}$) or less of the maximum of the measured values at all the data points of Sample C-1 to the total number of the data points was 12%.

The ratio of the number of data points at which a measured value was 50% (i.e., $2.2\times10^{18}$ $cm^{-3}$) or less of the maximum of the measured values at all the data points of Sample C-1 to the total number of the data points was 11%.

The ratio of the number of data points at which a measured value was 40% (i.e., $1.8\times10^{18}$ $cm^{-3}$) or less of the maximum of the measured values at all the data points of Sample C-1 to the total number of the data points was 11%.

Dislocation Density

For the main surface on the gallium-polar surface side of the substrate, a position 8 mm away from the center of the substrate was defined as the center of the measurement, and in a PL image, the number of dark spots in a region within 4 mm×4 mm was counted. The dislocation density was calculated from a value obtained by dividing the number of counted spots by the measured area.

As a result, the dislocation density was $4.1\times10^{4}$ $cm^{-2}$.

3. Example 2

(1) Preparation of Seed

A second c-plane GaN wafer having a thickness of 0.4 mm was formed in the same manner as in Example 1. The Ga-polar surface of the second c-plane GaN wafer was planarized to mirror-surface by polishing and then finished by CMP to remove a damaged layer. In Example 2, the off-angle of the Ga-polar surface of the second c-plane GaN wafer was changed to 0.55 degrees from the (0001) plane toward the <1-100> direction.

(2) Production of Ge-Doped c-Plane GaN Substrate

A c-plane GaN wafer having a diameter of about 2 inches, a Ga-polar surface area of about 20 $cm^2$, and a thickness of 0.4 mm obtained from the second c-plane GaN wafer was used as a seed, and a GaN thick film was grown on the Ga-polar surface by HVPE using a vapor phase growth apparatus having the same basic configuration as that of the HVPE apparatus illustrated in FIG. 9. The procedure was generally as described below.

Firstly, the seed was set on the susceptor. An edge cover was used.

Then, while $N_2$, $H_2$, and $NH_3$ were supplied into the reactor so that the partial pressures were 0.30 atm, 0.65 atm, and 0.05 atm, respectively, the reactor was heated with a heater provided outside the reactor.

After the susceptor temperature reached 1005° C., the susceptor temperature was kept constant, and GaN was grown. The temperature of the Ga reservoir was set at 800° C. The carrier gas supplied into the reactor was composed of 38% $H_2$ in molar ratio with $N_2$ as balance.

After the start of the growth, GaCl and $NH_3$ were supplied into the reactor so that the partial pressures were $9.5\times10^{-3}$ atm and $3.8\times10^{-2}$ atm, respectively, and a doping gas was not intentionally supplied for 300 minutes after the start of the growth.

300 minutes after the start of the growth, supply of $GeCl_4$ (tetrachlorogermane) into the reactor was started. The supply rate of $GeCl_4$ was gradually increased over 30 minutes.

A Ge-doped GaN thick film was grown to about 2.6 mm.

The growth rate of the Ge-doped GaN thick film calculated from the thickness and the growth time was about 48 μm/hr.

For the main surface on the Ga-polar surface side of the GaN crystal having the Ge-doped GaN thick film, the RMS roughness was calculated using a confocal laser microscope (model No. VK-X250). Specifically, 10 sub-square regions of 2 mm×2 mm were randomly selected on the main surface on the Ga-polar surface side of the GaN crystal, and the RMS roughness was measured in each sub-square region. The average of 10 RMS roughnesses measured in the respective 10 sub-square regions was 0.5 μm.

Subsequently, the Ge-doped GaN thick film was sliced parallel to the c-plane, and the Ga-polar surface of the resulting wafer was subjected to planarization by polishing and subsequent CMP finishing. Slice damage on the N-polar surface side of the wafer was removed by etching. Then, the wafer was cut to thereby complete a Ge-doped c-plane GaN substrate (hereinafter also referred to as "Sample E-2") having a thickness of 335 μm, a diameter of about 2 inches, and a main surface area of about 20 $cm^2$.

(3) Evaluation

Carrier Concentration Distribution

Figure 16:
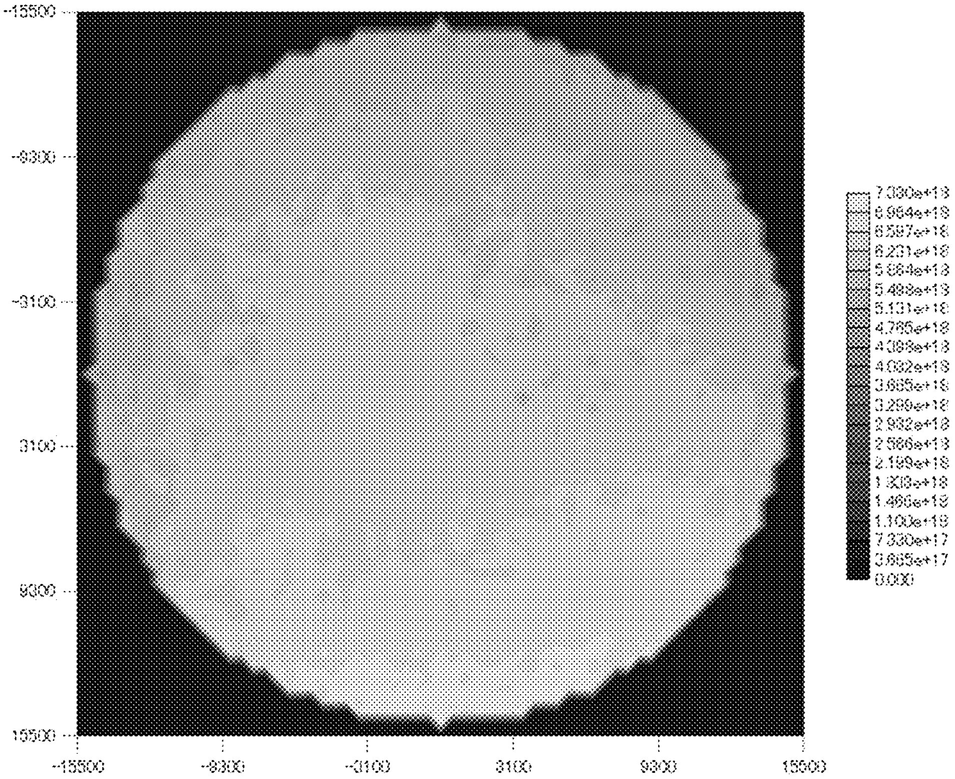
FIG. 16 is a carrier concentration mapping image obtained by Raman spectroscopy of an n-type GaN substrate of Example 2.

Carrier concentrations were measured at 0.5-mm intervals within a region of Φ 30 mm from the center of the main surface on the gallium-polar surface side of Sample E-2 using a Raman spectrometer (HORIBA, Ltd., LabRam HR800), to prepare a carrier concentration mapping image (FIG. 16). The number of data points (measurement points) of the carrier concentration mapping image was 10812. Raman spectroscopy was performed in the vicinity of the surface on the gallium-polar surface side of the substrate.

The average of the carrier concentrations at data points of the carrier concentration mapping image included in a circular region having a radius of 15 mm from the center of the main surface of Sample E-2 was $6.3\times10^{18}$ $cm^{-3}$. The maximum of the carrier concentrations at the data points of the carrier concentration mapping image included in the circular region was $7.3\times10^{18}$ $cm^{-3}$.

The ratio of the number of data points at which the carrier concentration was $2\times10^{18}$ $cm^{-3}$ or more to the total number of the data points (the ratio of the area of a region having a carrier concentration of $2\times10^{18}$ $cm^{-3}$ or more to the area of the circular region having a radius of 15 mm from the center of the main surface) was 100%.

On the carrier concentration mapping image, a total of four line segments having a length of 30 mm, passing through the center of the main surface, and forming angles of 0 degrees, 45 degrees, 90 degrees, and 135 degrees with the OF direction of the substrate were defined, and the average and standard deviation of carrier concentrations at data points of the carrier concentration mapping image corresponding to the points on the line segments were calculated. The calculated average and standard deviation were used to calculate the variation coefficient of carrier concentration (standard deviation/average). The variation coefficient of carrier concentration was 0.06.

On the line segments forming angles of 0 degrees and 90 degrees with the OF direction of the substrate, 59 measurement points at 0.5-mm intervals are the measurement points of the carrier concentration. On the line segments forming angles of 45 degrees and 135 degrees with the OF direction of the substrate, 43 measurement points at intervals of $0.5\times\sqrt{2}$ mm are the measurement points of the carrier concentration.

The ratio of the number of data points at which a measured value was 60% (i.e., $4.4\times10^{18}$ $cm^{-3}$) or less of the maximum of the measured values at all the data points of Sample E-2 to the total number of the data points was 0%.

The ratio of the number of data points at which a measured value was 50% (i.e., $3.7\times10^{18}$ $cm^{-3}$) or less of the maximum of the measured values at all the data points of Sample E-2 to the total number of the data points was 0%.

The ratio of the number of data points at which a measured value was 40% (i.e., $2.9\times10^{18}$ $cm^{-3}$) or less of the maximum of the measured values at all the data points of Sample E-2 to the total number of the data points was 0%.

Dislocation Density

For the main surface on the gallium-polar surface side of the substrate, a position 8 mm away from the center of the substrate was defined as the center of the measurement, and in a PL image, the number of dark spots in a region within 4 mm×4 mm was counted. The dislocation density was calculated from a value obtained by dividing the number of counted spots by the measured area.

As a result, the dislocation density was $5.1\times10^{4}$ $cm^{-2}$.

4. Comparative Example 2

A GaN crystal having a Ge-doped GaN thick film was produced in the same manner as in Comparative Example 1. For the main surface on the Ga-polar surface side of the GaN crystal having the Ge-doped GaN thick film, the RMS roughness was calculated in the same manner as in Example 2. Specifically, 10 sub-square regions of 2 mm×2 mm were randomly selected on the main surface on the Ga-polar surface side of the GaN crystal, and the RMS roughness was measured in each sub-square region. The average of 10 RMS roughnesses measured in the respective 10 sub-square regions was 1.1 μm.

5. Example 3

(1) Preparation of Seed

A second c-plane GaN wafer having a thickness of 0.4 mm was formed in the same manner as in Example 2.

(2) Production of Ge-Doped c-Plane GaN Substrate

A c-plane GaN wafer having a diameter of about 2 inches, a Ga-polar surface area of about 20 $cm^2$, and a thickness of 0.4 mm obtained from the second c-plane GaN wafer was used as a seed, and a GaN thick film was grown on the Ga-polar surface by HVPE using a vapor phase growth apparatus having the same basic configuration as that of the HVPE apparatus illustrated in FIG. 9. The GaN thick film was grown under the same conditions as in Example 2 except that the supply amount of $GeCl_4$ was changed.

(3) Evaluation

Carrier Concentration Distribution

Carrier concentrations were measured at 0.5-mm intervals within a region of Φ 30 mm from the center of the main surface on the gallium-polar surface side of Sample E-2 using a Raman spectrometer (HORIBA, Ltd., LabRam HR800), to prepare a carrier concentration mapping image. The number of data points (measurement points) of the carrier concentration mapping image was 10812. Raman spectroscopy was performed in the vicinity of the surface on the gallium-polar surface side of the substrate.

The average of the carrier concentrations at data points of the carrier concentration mapping image included in a circular region having a radius of 15 mm from the center of the main surface of Sample E-2 was $4.2\times10^{18}$ $cm^{-3}$. The maximum of the carrier concentrations at the data points of the carrier concentration mapping image included in the circular region was $4.5\times10^{18}$ $cm^{-3}$.

The ratio of the number of data points at which the carrier concentration was $2\times10^{18}$ $cm^{-3}$ or more to the total number of the data points (the ratio of the area of a region having a carrier concentration of $2\times10^{18}$ $cm^{-3}$ or more to the area of the circular region having a radius of 15 mm from the center of the main surface) was 100%.

On the carrier concentration mapping image, a total of four line segments having a length of 30 mm, passing through the center of the main surface, and forming angles of 0 degrees, 45 degrees, 90 degrees, and 135 degrees with the OF direction of the substrate were defined, and the average and standard deviation of carrier concentrations at data points of the carrier concentration mapping image corresponding to the points on the line segments were calculated. The calculated average and standard deviation were used to calculate the variation coefficient of carrier concentration (standard deviation/average). The variation coefficient of carrier concentration was 0.11.

On the line segments forming angles of 0 degrees and 90 degrees with the OF direction of the substrate, 59 measurement points at 0.5-mm intervals are the measurement points of the carrier concentration. On the line segments forming angles of 45 degrees and 135 degrees with the OF direction of the substrate, 43 measurement points at intervals of $0.5\times\sqrt{2}$ mm are the measurement points of the carrier concentration.

The ratio of the number of data points at which a measured value was 60% (i.e., $2.7\times10^{18}$ $cm^{-3}$) or less of the maximum of the measured values at all the data points of Sample E-2 to the total number of the data points was 7.3%.

The ratio of the number of data points at which a measured value was 50% (i.e., $2.3\times10^{18}$ $cm^{-3}$) or less of the maximum of the measured values at all the data points of Sample E-2 to the total number of the data points was 1.6%.

The ratio of the number of data points at which a measured value was 40% (i.e., $1.8\times10^{18}$ $cm^{-3}$) or less of the maximum of the measured values at all the data points of Sample E-2 to the total number of the data points was 0%.

Dislocation Density

For the main surface on the gallium-polar surface side of the substrate, a position 8 mm away from the center of the substrate was defined as the center of the measurement, and in a PL image, the number of dark spots in a region within 4 mm×4 mm was counted. The dislocation density was calculated from a value obtained by dividing the number of counted spots by the measured area.

As a result, the dislocation density was $2.8\times10^5$ $cm^{-2}$.

The present invention has been described based on specific embodiments above. However, each embodiment has been presented as an example and does not limit the scope of the present invention. Each embodiment described in the present specification can be modified in various ways without departing from the spirit of the invention and can be combined with a feature described by another embodiment within a practicable range.

REFERENCE SIGNS LIST

20 GaN substrate
21 First main surface
22 Second main surface
100 HVPE apparatus
101 Reactor
102 Gallium reservoir
103 Susceptor
104 First heater
105 Second heater
$Z_1$ First zone
$Z_2$ Second zone
$P_1$ Ammonia inlet pipe
$P_2$ Hydrogen chloride inlet pipe
$P_3$ Gallium chloride inlet pipe
$P_4$ Dopant inlet pipe
$P_E$ Exhaust pipe

What is claimed is:

1. An n-type GaN substrate comprising two main surfaces, the n-type GaN substrate comprising Ge as a donor impurity, having an average carrier concentration of $1\times10^{18}$ $cm^{-3}$ or more, and satisfying at least one selected from the group consisting of (1), (2), and (3) below when on at least one of the two main surfaces, a line segment (line segment A) having a length of 30 mm is defined to have a midpoint that coincides with a center of the main surface;

a line segment (line segment B) having a length of 30 mm is defined to have a midpoint that coincides with the center of the main surface and to be orthogonal to the line segment A;

among square grid points provided at intervals of 0.5 mm with respect to the line segment A and the line segment B serving as two axes, the square grid points located in a circular region having a radius of 15 mm from the center of the main surface are used as measurement points; and carrier concentrations are measured at the measurement points:

(1) an average and a standard deviation of carrier concentrations at all measurement points on the line segment A, the line segment B, and two line segments that are bisectors of angles formed by the line segment A and the line segment B satisfy Formula (i) below:

$$\text{standard deviation/average} \leq 0.25 \quad (i);$$

(2) a ratio of the number of measurement points at which a carrier concentration is $2\times10^{18}$ $cm^{-3}$ or more to the total number of the measurement points is 90% or more; and (3) at least one selected from the group consisting of conditions (A), (B), and (C) below is satisfied:

(A) a ratio of the number of measurement points at which a measured value is 60% or less of the maximum of measured values at all measurement points to the total number of the measurement points is 10% or less;

(B) a ratio of the number of measurement points at which a measured value is 50% or less of the maximum of measured values at all measurement points to the total number of the measurement points is 9% or less; and (C) a ratio of the number of measurement points at which a measured value is 40% or less of the maximum of measured values at all measurement points to the total number of the measurement points is 8% or less.

2. The n-type GaN substrate according to claim 1, wherein the line segment A is substantially parallel to any crystal orientation parallel to the surface of the n-type GaN substrate.

3. The n-type GaN substrate according to claim 2, having an orientation flat for identifying the crystal orientation.

4. The n-type GaN substrate according to claim 1, satisfying (1).

5. The n-type GaN substrate according to claim 1, satisfying (2).

6. The n-type GaN substrate according to claim 1, satisfying (3).

7. The n-type GaN substrate according to claim 1, satisfying all of (1), (2), and (3).

8. The n-type GaN substrate according to claim 1, including:

a first region on one main surface side, the first region satisfying at least one selected from the group consisting of (1), (2), and (3); and a second region on the other main surface side, the second region having a lower carrier concentration than the first region.

9. The n-type GaN substrate according to claim 1, wherein a donor impurity contained in the n-type GaN substrate at the highest concentration is Ge.

10. The n-type GaN substrate according to claim 1, having a diameter of 40 mm or more.

11. The n-type GaN substrate according to claim 1, wherein one of the two main surfaces is Ga-polar and is tilted by 0 degrees or more and 10 degrees or less relative to a (0001) crystal plane.

12. The n-type GaN substrate according to claim 1, wherein a dislocation density in at least one main surface is $5\times10^5$ $cm^{-2}$ or less.

13. An n-type GaN crystal comprising two main surfaces, the n-type GaN crystal being doped with Ge as a donor impurity, and having an average carrier concentration of $1\times10^{18}$ $cm^{-3}$ or more, wherein when 10 sub-square regions of 2 mm×2 mm are randomly selected on at least one of the two main surfaces, an average of 10 root-mean-square roughnesses measured at the respective 10 sub-square regions is 1 μm or less.

14. The n-type GaN crystal according to claim 13, wherein the main surface including the sub-square regions is not planarized.

15. The n-type GaN crystal according to claim 13, wherein a donor impurity contained in the n-type GaN crystal at the highest concentration is Ge.

* * * * *